United States Patent [19]
Dave et al.

[11] Patent Number: 6,117,180
[45] Date of Patent: Sep. 12, 2000

[54] HARDWARE-SOFTWARE CO-SYNTHESIS OF HETEROGENEOUS DISTRIBUTED EMBEDDED SYSTEMS FOR LOW OVERHEAD FAULT TOLERANCE

[75] Inventors: Bharat P. Dave, Howell; Niraj K. Jha, Princeton, both of N.J.

[73] Assignee: Lucent Technologies Inc., Murray Hill, N.J.

[21] Appl. No.: 09/024,605

[22] Filed: Feb. 17, 1998

Related U.S. Application Data

[60] Provisional application No. 60/038,488, Feb. 24, 1997, provisional application No. 60/038,934, Feb. 24, 1997, and provisional application No. 60/054,709, Aug. 4, 1997.

[51] Int. Cl.$^7$ .................................................. G06F 9/44
[52] U.S. Cl. .................................. 703/20; 703/2; 703/22; 703/23; 709/102; 709/104; 709/105; 712/28; 712/30; 717/5; 717/8
[58] Field of Search ........................ 395/500.41, 500.44, 395/500.48, 672, 674, 676, 706, 710; 709/102, 104, 105; 712/28, 30; 703/20, 22, 23, 27, 2; 717/5, 8

[56] References Cited

U.S. PATENT DOCUMENTS

| | | | |
|---|---|---|---|
| 4,885,684 | 12/1989 | Austin et al. | 717/6 |
| 5,202,987 | 4/1993 | Bayer et al. | 709/102 |
| 5,210,872 | 5/1993 | Ferguson et al. | 709/102 |
| 5,418,953 | 5/1995 | Hunt et al. | 709/102 |
| 5,452,461 | 9/1995 | Umekita et al. | 717/6 |
| 5,590,323 | 12/1996 | Kartalopoulos | 709/106 |
| 5,742,821 | 4/1998 | Prasanna | 709/102 |
| 5,768,594 | 6/1998 | Blelloch et al. | 717/6 |
| 5,781,787 | 7/1998 | Shafer et al. | 712/28 |
| 5,870,588 | 2/1999 | Rompaey et al. | 3995/500 |

OTHER PUBLICATIONS

"Dynamic Critical–Path Scheduling: An Effective Technique for Allocating Task Graphs to Multiprocessors", by Yu–Kwong Kwok, Ishfaq Ahmad, IEEE Transactions on Parallel and Distributed Systems, vol. 7, No. 5, May 1996, 17 pages.
"Efficient Scheduling Algorithms for Real–Time Multiprocessor Systems", by Krithi Ramamritham, John A. Stankovic, and Perng–Fei Shiah, IEEE Transactions on Parallel and Distributed, vol. 1, No. 2, Apr. 1990, 12 pages.
"Exploiting Unused Periodic Time for Aperiodic Service Using the Extended Priority Exchange Algorithm", by Brinkley Sprunt, John Lehoczky, and Lui Sha, IEEE Computer Society Real–Time Systems Symposium, Dec. 6–8, 1988, pp. 251–258.

(List continued on next page.)

*Primary Examiner*—Kevin J. Teska
*Assistant Examiner*—Samuel Broda
*Attorney, Agent, or Firm*—Steve Mendelsohn

[57] ABSTRACT

Embedded systems employed in critical applications demand high reliability and availability in addition to high performance. Hardware-software co-synthesis is the process of partitioning an embedded system specification into hardware and software modules to meet performance, cost, reliability, and availability goals. The present invention addresses the problem of hardware-software co-synthesis of fault-tolerant real-time heterogeneous distributed embedded systems. Fault detection capability is imparted to the embedded system by adding assertion and duplicate-and-compare tasks to the task graph specification prior to co-synthesis. The reliability and availability of the architecture are evaluated during co-synthesis. On embodiment of the present invention, called COFTA, allows the user to specify multiple types of assertions for each task. It uses the assertion or combination of assertions that achieves the required fault coverage without incurring too much overhead. New methods are proposed to: 1) perform fault tolerance based task clustering, which determines the best placement of assertion and duplicate-and-compare tasks, 2) derive the best error recovery topology using a small number of extra processing elements, 3) exploit multi-dimensional assertions, and 4) share assertions to reduce the fault tolerance overhead. The present algorithm can tackle multirate systems commonly found in multimedia applications.

33 Claims, 18 Drawing Sheets

OTHER PUBLICATIONS

"Hardware–Software Co–Design of Embedded Systems", by Wayne H. Wolf, Proceedings of the IEEE, vol. 82, No. 8, Jul. 1994, pp. 967–989.

"A Hardware–Software Codesign Methodology for DSP Applications", by Asawaree Kalavade and Edward A. Lee, Sep. 1993 IEEE Design & Test of Computers, pp. 16–28.

"Hardware–Software Cosynthesis for Digital Systems", by Rajesh K. Gupta and Giovanni De Micheli, Sep. 1993, IEEE Design & Test of Computers, pp. 29–40.

A Hardware/Software Partitioner Using a Dynamically Determined Granularity, by Jörg Henkel and Rolf Ernst, DAC 97–Jun. 1997 Anaheim, CA, 3 pages.

"Hill–Climbing Heuristics for Optical Hardware, Dimensioning and Software Allocation in Fault–Tolerant Distributed Systems", by Fausto Distant and Vincenzo Piuri, IEEE Transactions on Reliability, vol. 38, No. 1, 1989 Apr., pp. 28–39.

"Load Sharing with Consideration of Future Task Arrivals in Heterogeneous Distributed Real–Time Systems", by Chao–Ju Hou and Kang G. Shin, 1991 IEEE Real–Time Computer Laboratory, pp. 94–103.

"Low Overhead Fault Tolerance for Real–Time Distributed Systems: Application to Hardware/Software Co–Synthesis of Embedded Systems", by Santhanam Srinivasan and Niraj K. Jha, 31 pages, corresponding to conference paper presented Sep. 1995 in Proc. European Design Automation Conf.

"On–Line Scheduling of Hard Deadline Aperiodic Tasks in Fixed–Priority Systems", by Sandra Ramos–Thuel and John P. Lehoczky, 1993 IEEE, pp. 160–171.

"On–Line Scheduling of Real–Time Tasks", by Kwang S. Hong and Joseph Y.–T. Leung, 1988 IEEE Computer Society, pp. 244–250.

On the Complexity of Fixed–Priority Scheduling of Periodic, Real–Time Tasks, by Joseph Y.–T. Leung and Jennifer Whitehead, 1982 North–Holland Publishing Company, Performance Evaluation 2 (1982), pp. 237–250.

"On Non–Preemptive Scheduling of Periodic and Sporadic Tasks", by Kevin Jeffay, Donald F. Stanat, and Charles U. Martel, Dec. 1991 IEEE Twelfth Real–Time Systems Symposium, pp.129–139.

Optimal Algorithms for Synthesis of Reliable Application–Specific Heterogeneous Multiprocessors, by Aurobindo Dasgupta and Ramesh Karri, IEEE Transactions on Reliability, vol. 44, No. 4, 1995 Dec., pp. 603–613.

"Optimal Priority Assignment for Aperiodic Tasks With Firm Deadlines in Fixed Priority Pre–Emptive Systems", by Robert Davis and Alan Burns, Information Processing Letters, vol. 53, No. 5, Mar. 1995, pp. 249–254.

"Performance Estimation for Real–Time Distributed Embedded Systems", by Ti–Yen Yen and Wayne Wolf, Dept. of Electrical Engineering, Princeton University, pp. 1–6, Proc. of Intl. Conf. on Computer Design, Oct. 1995.

"Process Partitioning for Distributed Embedded Systems", by Junwei Hou and Wayne Wolf, Sep. 1996 IEEE, pp. 70–75.

"Program Implementation Schemes for Hardware–Software Systems", by Rajesh K. Gupta, Claudionor N. Coelho Jr., and Giovanni De Micheli, Jan. 1994 IEEE, vol. 27, No. 1, pp. 48–55.

"Rate–Monotonic Analysis for Real–Time Industrial Computing", by Mark H. Klein et al., Jan. 1994, vol. 27, No. 1, pp. 24–33.

"Replication and Allocation of Task Modules in Distributed Real–Time Systems", by Chao–Ju Hou and Kang G. Shin, Jun. 1994, IEEE Computer Society, pp. 26–35.

"Scheduling Algorithms and Operating Systems Support for Real–Time Systems", by Krithi Ramamritham and John A. Stankovic, Proceedings of the IEEE, vol. 82, No. 1, Jan. 1994, pp. 55–67.

"Scheduling Parallel I/O Operations in Multiple Bus Systems", by Ravi Jain et al., Journal of Parallel and Distributed Computing 16, 1992, pp. 352–362.

"Scheduling Periodically Occurring Tasks on Multiple Processors", by Eugene L. Lawler and Charles U. Martel, Information Processing Letters, vol. 12, No. 1, Feb. 1981.

"Scheduling Slack Time in Fixed Priority Pre–emptive Systems", by R.I. Davis, K.W. Tindell, and A. Burns, Dec. 1993 IEEE Real–Time Systems Symposium, pp. 222–231.

"Scheduling Tasks with Resource Requirements in Hard Real–Time Systems", by Wei Zhao et al., IEEE Transactions on Software Engineering, vol. SE–13, No. 5, May 1987, pp. 564–577.

"Sensitivity–Driven Co–Synthesis of Distributed Embedded Systems", by Ti–Yen Yen and Wayne Wolf, International Symposium on System Synthesis, 1995, pp. 1–6.

"SIERA: A Unified Framework for Rapid–Prototyping of System–Level Hardware and Software", by Mani B. Srivastava and Robert W. Brodersen, IEEE Transactions on Computer–Aided Design of Integrated Circuits and Systems, vol. 14, No. 6, Jun. 1995, pp. 676–693.

"SOS: Synthesis of Application–Specific Heterogeneous Multiprocessor Systems", by Shiv Prakash and Alice C. Parker, Journal of Parallel and Distributed Computing, vol. 16, No. 4, pp. 338–351 (1992).

"SpecCharts: A VHDL Front–End for Embedded Systems", by Frank Vahid, Sanjiv Narayan, and Daniel D. Gajski, IEEE Transactions on Computer–Aided Design of Integrated Circuits and Systems, vol. 14, No. 6, Jun. 1995, pp. 694–706.

"Synthesis of Application Specific Instruction Sets", Ing–Jer Huang and Alvin M. Despain, IEEE Transactions of Computer–Aided Design of Integrated Circuits and Systems, vol. 14, No. 6, Jun. 1995, pp. 663–675.

"System–Level Synthesis of Low–Power Hard Real–Time Systems", by Darko Kirovski and Miodrag Potkonjak, DAC97, Jun. 1997, Anaheim, CA, 6 pages.

"Task Allocation for Maximizing Reliability of Distributed Computer Systems", by Sol M. Shatz, Jia–Ping Wang, and Masanori Goto, IEEE Transactions on Computers, vol. 41, No. 9, Sep. 1992, pp. 1156–1160.

"TBFT: A Task–Based Fault Tolerance Scheme for Distributed Systems", by Shalini Yajnik, Santhanam Srinivasan, Niraj K. Jha, Seventh International Conference on Parallel and Distributed Computing Systems, Oct. 1994, 21 pages.

"TigerSwitch: A Case Study in Embedded Computing System Design", by Wayne Wolf, Andrew Wolfe, Steve Chinatti, Ravi Koshy, Gary Slater, and Spencer Sun, 0–8186–6315–4/94, 1994 IEEE, pp. 89–96.

"Dynamic Scheduling of Real–Time Aperiodic Tasks on Multiprocessor Architectures," by Babak Hamidzadeh and Yacine Atif, 1996 IEEE, Proceedings of the 29th Annual Hawaii International Conference on System Sciences, pp.

"Hardware–Software Co–Synthesis of Fault–Tolerant Real–Time Distributed Embedded Systems," by Santhanam Srinivasan and Niraj K. Jha, 1995 IEEE, Design Automation Conference 1995, with EURO–VHDL, Proceedings EURO–DAC '95, European.

"Embedded Architecture Co–Synthesis and System Integration", by Bill Lin et al., Hardware/Software Co–Design, Mar. 1996 IEEE, Fourth International Workshop, pp. 2–9.

"Hardware–Software Codesign and GRAPE", by Marlee Adé et al., Rapid System Prototyping, Jun. 1995, Proceedings, Sixth IEEE International Workshop on Rapid System Prototyping, pp. 40–47.

"Object–Oriented Co–Synthesis of Distributed Embedded Systems", by Wayne Wolf, Proceedings of the ASP–DAC '95/VLSI '95, Design Automation Conference, Sep. 1995, pp. 553–558.

"An Approach to the Adaptation of Estimated Cost Parameters in the COSYMA System," by D. Hermann et al., Proceedings of the Third International Workshop on Hardware/Software CoDesign, 1994, pp. 100–107.

"Architectural Partitioning for System Level Synthesis of Integrated Circuits," by E. Lagnese et al., IEEE Computer Aided Design of Integrated Circuits and Systems, 1991, pp. 847–860.

"CoWare–A Design Environment for Heterogeneous Hardware/Software Systems," by Van Rompaey et al., Design Automation Conference, 1996, pp. 252–257.

"Fast Timing Analysis for Hardware–Software Co–Synthesis," by R. Ernst et al., VLSI in Computes and Processors, 1993, pp. 452–457.

"Hardware–Software Cosynthesis for Microcontrollers," by R. Ernst et al., IEEE Design & Test of Computers, Dec. 1993, pp. 64–75.

"Synthesis and Analysis of an Industrial Embedded Microcontroller," by Ing–Jer Huang et al., Design Automation Conference, 1997, pp. 151–156.

Srinivasan et al, "Hardware–Software Co–Synthesis of Fault–Tolerant Real–Time Distributed Embedded Systems", IEEE Proceedings of the 1995 European Design Automation Conference EURO–DAC '95, pp. 334–339, Sep. 1995.

"A Global Criticality/Local Phase Driven Algorithm for the Constrained Hardwdare/Software Partitioning Problem", by Asawaree Kalavade and Edward A. Lee; 1994 IEEE, pp. 42–48.

"Algorithms for Scheduling Hard Aperiodic Tasks in Fixed–Priority Systems using Slack Stealing", by Sandra R. Thuel and John P. Lehoczky, 1994 IEEE, pp. 22–33.

"Allocation of Periodic Task Modules with Precedence and Deadline Constraints in Distributed Real–Time Systems", by Chao–Ju Hou and Kang G. Shin, 1992 IEEE Computer Society Technical Committee on Real–Time Systems, 11 pages.

"An Efficient Algorithm for Graph Isomorphism", by D.G. Corneil and C.C. Gotlieb, Journal of the Association for Computing Machinery, vol. 17, No. 1, Jan. 1970, pp. 51–64.

"An Optimal Algorithm for Scheduling Soft–Aperiodic Tasks in Fixed–Priority Preemptive Systems", by John P. Lehoczky and Sandra Ramos–Thuel, 1992 IEEE Computer Society Technical Committee on Real–Time Systems, 15 pages.

"Aperiodic Servers in a Deadline Scheduling Environment", by T.M. Ghazalie and T.P. Baker; Realtime Systems 9, (1995), pp. 31–67.

"Architectural Support For Designing Fault–Tolerant Open Distributed Systems", by Salim Hariri, Alok Choudhary, and Behcet Sarikaya, 1992 IEEE.

"Calculating the Maximum Execution Time of Real–Time Programs", by P. Puschner and C.H. Koza, The Journal of Real–Time Systems, 1,(1989), pp. 159–176.

"Communication Synthesis for Disbributed Embedded Systems", by Ti–Yen Yen and Wayne Wolf, Proceedings of International Conference on Computer–Aided Design, pp. 288–294, Nov. 1995.

"Computer–Aided Hardware–Software Codesign", by Giovanni De Micheli, Aug. 1994 IEEE Micro Chips, Systems, Software, and Applications, 8 pages.

"Configuration–Level Hardware/Software Partitioning for Real–Time Embedded Systems", by Joseph G. D'Ambrosio and Xiaobo (Sharon) Hu, 1994 IEEE, pp. 34–41.

"Constrained Software Generation for Hardware–Software Systems", by Rajesh K. Gupta and Giovanni De Micheli, 1994 IEEE, pp. 56–63.

FIG. 1A

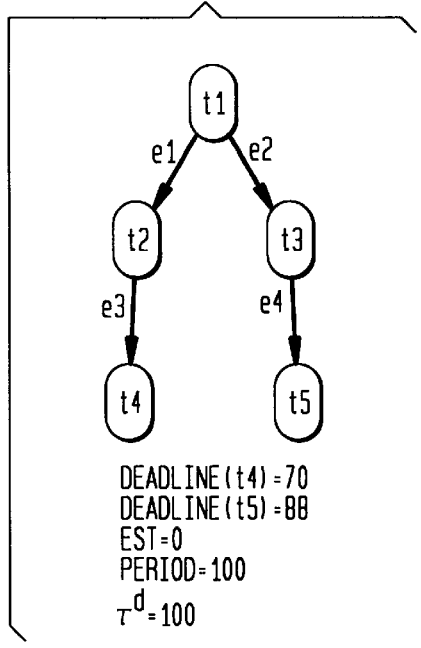

DEADLINE(t4)=70
DEADLINE(t5)=88
EST=0
PERIOD=100
$T^d = 100$

FIG. 1B

PE LIBRARY:[P1,P2,ASIC1,ASIC2]
PE COST: $ [100,150,35,60]
LINK LIBRARY:[L1,L2]
LINK COST: $ [15,25]

FIG. 1D

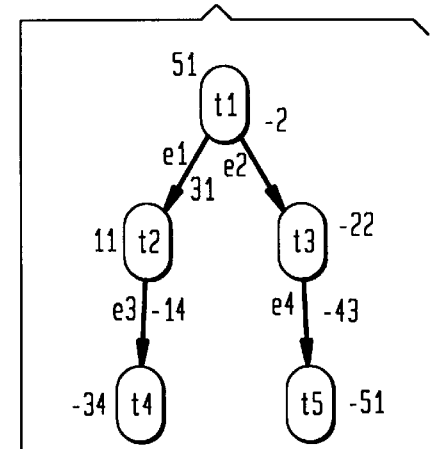

FIG. 1C execution_vector(t1) = [20,10,x,x]   communication_vector(e1) = [20,15]
execution_vector(t2) = [25,15,x,x]   communication_vector(e2) = [20,15]
execution_vector(t3) = [21,11,x,x]   communication_vector(e3) = [20,15]
execution_vector(t4) = [36,21,x,x]   communication_vector(e4) = [8,5]
execution_vector(t5) = [37,22,x,x]   communication_vector(e5) = [15,10]
execution_vector(t3c) = [x,x,7,4]    communication_vector(e6) = [8,5]
execution_vector(t4c) = [x,x,8,5]    communication_vector(e7) = [15,10]
execution_vector(t5c) = [x,x,10,5]

x=NOT APPLICABLE, i.e. NON-PREFERENCE

FIG. 1E

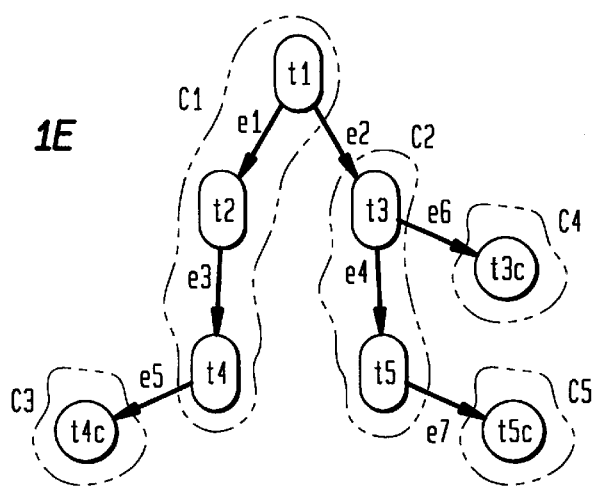

FIG. 4

```
ASSIGN_ASSERTION_OVERHEADS(task graphs){
  mark each task unvisited;
  for each unvisited task $t_j${
    if($t_j$ has an assertion){
      $t_j$_assertion_overhead=$\gamma^{max}(t_j,t_{ic})+\pi^{max}(t_{ic})$;}
    else{
      $t_j$_assertion_overhead=$\sum\gamma^{max}(t_j,t_{id})+\pi^{max}(t_{id})+2\cdot\gamma^{max}(t_j,t_{ic})+\pi^{max}(t_{ic})$;}
      //Factor of "2" due to the additional communication edge $(t_{id},t_{ic})$. $t_j$ is a fan-in task of task $t_{id}$
    mark $t_j$ visited;
  }
}

ASSIGN_FT_LEVELS(task graphs){
  mark each task unvisited;
  for each unvisited task $t_j${
    if($t_j$ is a sink task){
      $t_j$_ft_level=$t_j$_assertion_overhead;}
    else{
      $t_j$_ft_level=max(ft_level of fanout task $t_j$+$\gamma^{max}(t_j,t_j))+t_j$_assertion_overhead;}
    mark $t_j$ visited;
  }
}
```

FIG. 5

```
CLUSTERING_FOR_CBFT(task graphs,τ^d){
  sorted_list ← sort tasks by decreasing priority levels;
  threshold=hyperperiod;
  for each task t_i{t_i.tag=NOT_CLUSTERED);}
  cluster_list ← NULL;
  for each unclustered task t_j from sorted_list{
    fan-in-set (t_j)=NULL;
    for each fan-in task t_j{
      if(t_j is not already clustered with another fanout task and its cluster is compatible with t_i){
        if(size(cluster(t_j)U t_i) ≤ hyperperiod){
          fan-in-set(t_j) = fan-in-set(t_j)+t_j;}
      }
    }
    if(fan-in-set(t_j)=NULL){
      allocate a new cluster C_j;
      cluster_list ← cluster_list U {C_j};
      EXPAND_CLUSTER(C_j,t_j,τ^d);}
    else{
      t_k ← a task from fan-in-set(t_j) with the highest FT level along task t_j;
      C_j=cluster(t_k);
      make ∀(t_k,t_j) equal to zero;
      EXPAND_CLUSTER(C_j,t_j,τ^d);}
    sorted_list ← sort tasks by decreasing priority levels;
  }
  for each cluster C_m {
    if(there is no assertion or duplicate-and-compare task at the output of the last task){
      add assertion or duplicate-and-compare task for the last task;}
  }
  return cluster_list;
}
```

FIG. 6

```
EXPAND_CLUSTER(Cluster C_k, task t_i, τ_i^d){
  t_k=last task of cluster C_k;
  C_k=C_k U{t_i};//add task t_i to cluster C_k
  Add an assertion task or duplicate-and-compare tasks for t_k if: t_i is a sink task with no assertion OR
  none of t_i's fan-out tasks are error-transparent and t_i has no assertion OR fault detection time at
  t_i exceeds τ_i^d;
  update preference and exclusion vectors of cluster C_k;
  t_i.tag=CLUSTERED;
  if(C_k has more than one task){
    assign priority levels and FT levels(t_i.task_graph);}
  if(size of cluster C_k is < hyperperiod){
    find the fan-out-set of t_i among its unclustered fanout tasks which are compatible with cluster C_k;
    if(fan-out-set is not empty){
      eligible_fan_out_task t_m ← a task from the fan-out-set along the edge from t_i to which
      the FT level of t_i is highest and the size of (C_k U t_m) is < hyperperiod;}
    if(t_m exists){
      make Ψ(t_i, t_m)equal to zero;
      Add an assertion task or duplicate-and-compare tasks for t_i if: t_m is a sink task with no assertion
      OR one of t_m's fanout tasks is error-transparent and t_m has no assertion OR fault detection time
      at t_m exceeds τ_i^d;
      C_k=C_k U {t_m};// add task t_m to cluster C_k
      update preference and exclusion vectors of cluster C_k;
      t_m.tag=CLUSTERED;
      assign priority levels and FT levels(t_i.task_graph);}
  }
  else {
    add an assertion task or duplicate-and-compare tasks for the last task in C_k and continue;}
    //C_k is not expandable
    return cluster_list;
}
```

FIG. 7A

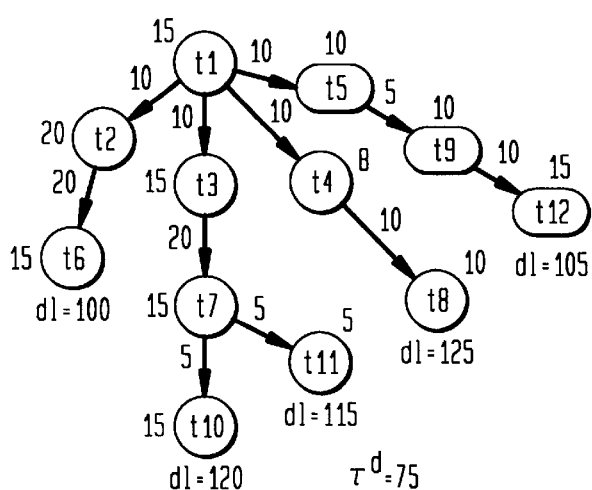

FIG. 7C assertion_task(t1c)=5,edge(t1,t1c)=10
assertion_task(t2c)=2,edge(t2,t2c)=20
compare_task(t3c)=5,edge(t3d,t3c)=20
assertion_task(t4c)=2,edge(t4,t4c)=10
assertion_task(t5c)=5,edge(t5,t5c)=5
assertion_task(t6c)=8,edge(t6,t6c)=10
assertion_task(t7c)=5,edge(t7,t7c)=5
compare_task(t8c)=5,edge(t8d,t8c)=10
compare_task(t9c)=5,edge(t9d,t9c)=10
assertion_task(t10c)=2,edge(t10,t10c)=10
assertion_task(t11c)=2,edge(t11,t11c)=5
assertion_task(t12c)=5,edge(t12,t12c)=10
as_overhead(t1)=15,as_overhead(t7)=10
as_overhead(t2)=22,as_overhead(t8)=45
as_overhead(t3)=70,as_overhead(t9)=40
as_overhead(t4)=12,as_overhead(t10)=12
as_overhead(t5)=10,as_overhead(t11)=7
as_overhead(t6)=18,as_overhead(t12)=15

FIG. 7B

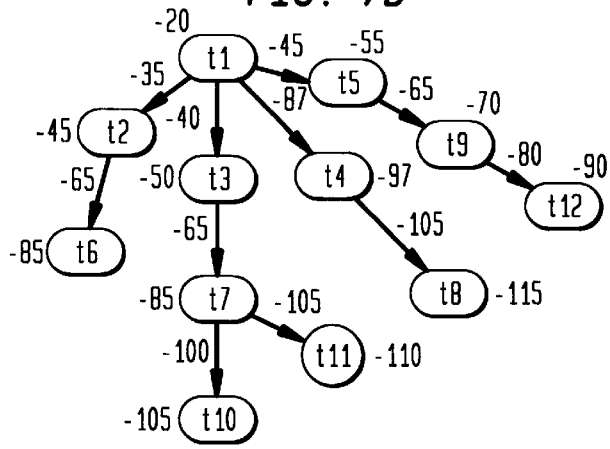

FIG. 7D

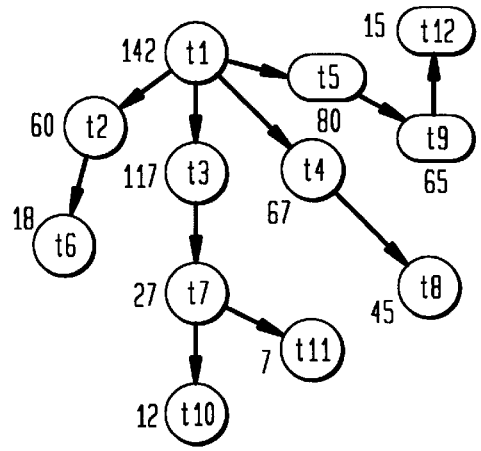

FIG. 7E

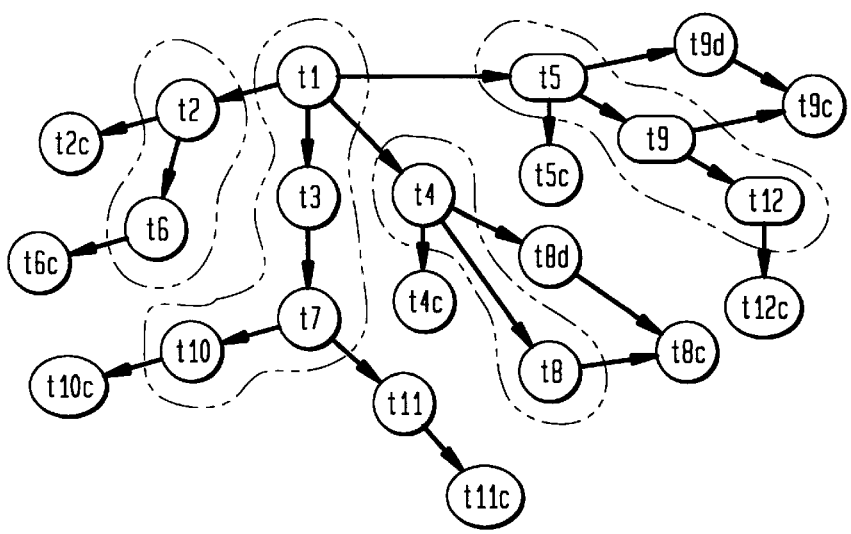

FIG. 8

```
ASSERTION_SHARING(architecture, task graphs,τ^d){
  for each PE pe_i in the architecture{
    assertion_list←create a list of assertion tasks allocated to pe_i;
    mark each assertion from assertion_list unshared;
    sort assertion_list in the order of decreasing execution cost;
    assertion_sharing_group_list=NULL;
    for each unshared t_ic from sorted assertion_list{
      create an assertion_sharing_group A_j;
      add t_ic to group A_j;
      mark t_ic shared;
      assertion_sharing_group_list=assertion_sharing_group_list + A_j;
      if (t_ic_architecture_hint implies sharing){
        associated_assertion_list←create a list of unshared assertions of the same type
          based on the architecture hint;
        EXPAND_ASSERTION_GROUP(A_j,t_ic,associated_assertion_list);
      }
      else if(system assertion_sharing=FREE){
        //unrestricted assertion sharing system synthesis option
        associated_assertion_list←create a list of unshared assertions of the same type
        EXPAND_ASSERTION_GROUP(A_j,t_ic,associated_assertion_list);
      }
    }
  }
  return assertion_sharing_group_list;
}

EXPAND_ASSERTION_GROUP(assertion_group_id,assertion_id,associated_assertion_list){
  A_m=assertion_group_id;
  t_ic=assertion_id;
  for each t_jc in associated_assertion_list(t_jc_tag=UNVISITED;)
  for each unshared and unvisited t_jc in the associated_assertion_list{
    t_jc_tag=VISITED;
    if(there is no overlap of start and finish times among all the assertions in A_m and t_jc AND
       the fault detection time at task t_j does not exceed τ^d after modifying the assertion execution time
       due to sharing AND the resource/power requirement is decreasing){
      modify assertion task execution time based on assertion_excess_overhead_vector;
      remove t_jc from the task graph and connect incoming edge of t_jc to t_ic;
      t_jc_tag=SHARED;
    }
  }
}
```

EST=0  EST=0
deadline=60  deadline=45
period=80  period=80 assertion_excess_
overhead_vector
(t3c)=[0,0.5]

FIG. 11

```
DEFINE_ERROR_RECOVERY_TOPOLOGY(architecture,list_of_architecture_hints_for_FG,
  task graphs){
  mark each PE and link of the architecture unprotected;
  hint_list=list_of_architecture_hints_for_FG;
  FG_list=NULL;//initialize failure group list;
  j=0;
  if(hint_list*NULL){
    for each hint $h_j$ in hint_list{
      //Each $h_j$ represents a group of tasks and the PEs and links to which it is allocated.
      //This group of PEs and links forms the PG for an FG.
      $FG_j$=NULL;add $FG_j$ to FG_list;
      create PG(j);$FG_j$=$FG_j$ + PG(j);
      duplicate PG(j) and add to $FG_j$;
      mark all PE(s) and link(s) of PG(j) protected;
      if ($h_j$ indicates 1-to-N protection){
        EXPAND_FAILURE_GROUP(PG(j), $FG_j$, architecture, $h_j$);
        j++;}
    }
  }
  if(all PEs and links are not protected){
    CREATE_FAILURE_GROUPS(architecture, FG_list);}
  return FG_list;
}
EXPAND_FAILURE_GROUP(PG, FG, architecture, hint){
  current_FG=FG;
  $h_s$=hint;
  PG_limit=min (max number of each associated task graph executed on PG);
  if ($h_s$*NULL){
    expand PG in the horizontal dimension such that PG_limit is not exceeded;}
  unavailability_threshold=minimum of unavailability constraints of all task graphs mapped to PG;
  create list L which satisfies the following two conditions{
    condition 1:
      if($h_s$*NULL){
        each member of L is a group of unprotected PEs and links that performs the type of
        tasks indicated by $h_s$;}
      else{
        each member of L is a group of the same type of PE(s) and/or link(s) as that of PG;}
    condition 2:
      the architecture graph of group is isomorphic to that of PG;
  }
  for each group $l_m$ from list L{
    if(unavailability of(current_FG+$l_m$) $\leq$ unavailibity_threshold){
      current_FG=current_FG+$l_m$;
      mark PE(s)and link(s)of $l_m$ protected;}
  }
}
```

FIG. 12

```
CREATE_FAILURE_GROUPS(architecture,FG_list){
    create list F of unprotected PE(s) and link(s);
    sort list F in the order of decreasing FIT rates;
    for each member $f_n$ of sorted list F{
        create FG(n) containing $f_n$;
        FG_list=FG_list + FG(n);
        create PG containing $f_n$;

PG_limit = min (max number of each associated task graph executed on the PG);
        expand PG in the horizontal dimension such that PG_limit is not exceeded; add 1-to-1 protection for $f_n$;
        mark $f_n$ protected;
        EXPAND_FAILURE_GROUP($f_n$,FG,architecture,NULL);
    }
    return FG_list;
}
```

FIG. 13A
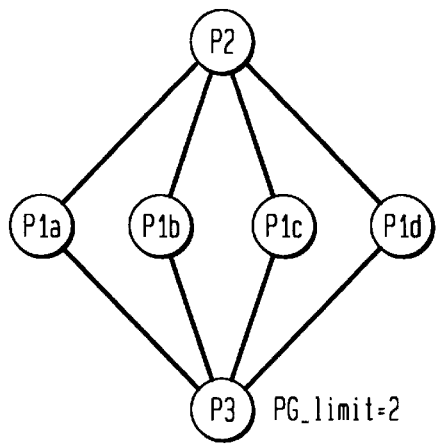
FIG. 13B
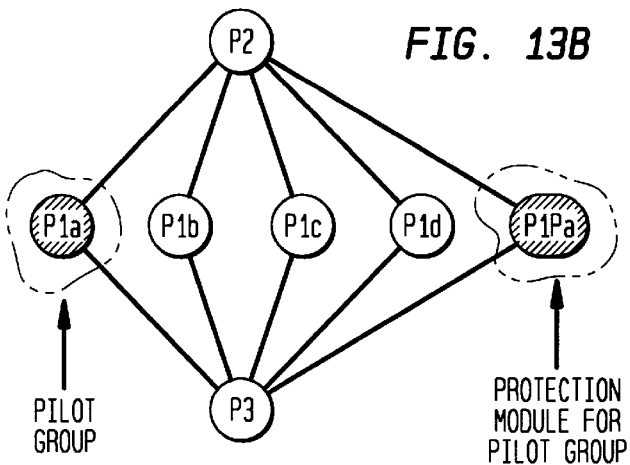
FIG. 13C
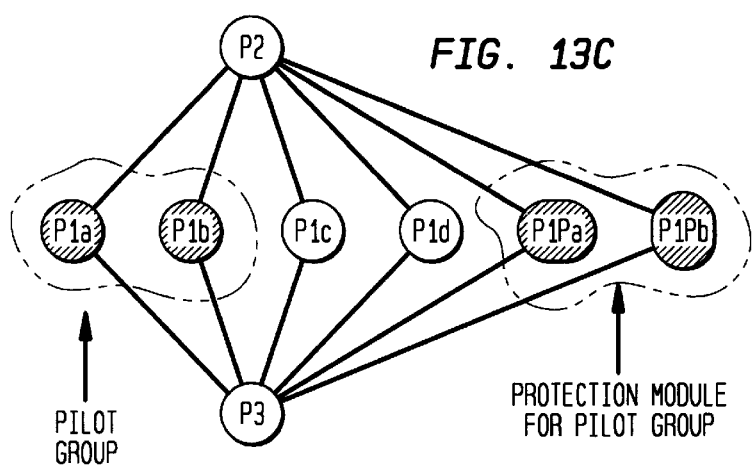
FIG. 13D
FIG. 13E
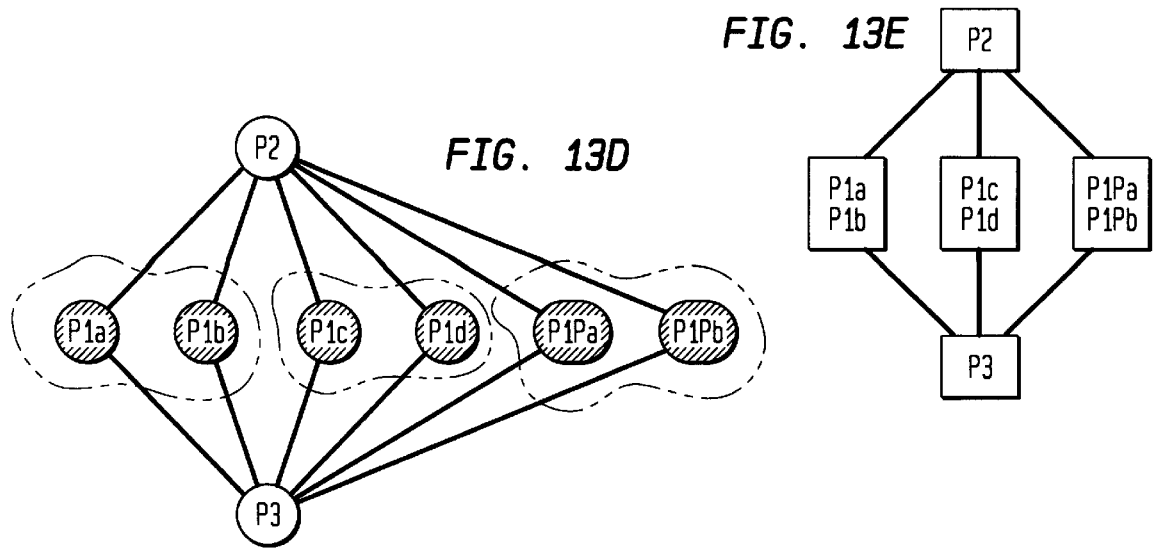

FIG. 14

```
EVALUATE_ARCHITECTURE_DEPENDABILITY(architecture,task graphs,
  list_of_failure_groups,list_of_function_unavailability_constraints,MTTR){
  FG = list_of_failure_groups;
  i = 0;
  j = 0;
  FC=list_of_function_unavailability_constraints;
  for each group $\mathfrak{R}_i${$\mathfrak{R}_i$_tag = UNVISITED;}
  for each unvisited $\mathfrak{R}_j$ from FG {
    $\mathfrak{R}_j$_tag = VISITED;
    $U_j$= unavailability of the failure group using Markov models;
    if($U_j$ > $\mathfrak{R}_j$_unavailability_constraint){
      increase the background diagnostic frequency and recalculate $U_j$;
      if($U_j$ > $\mathfrak{R}_j$_unavailability_constraint){
        return $\mathfrak{R}_j$_allocation_failure; break;}
      }
    }
    for each function constraint $F_j$ of FC{//examples: controller, transmission, synchronization, etc.
      $FIG_j$ = the associated failure group interconnection graph;
      $FIG_j$_unavailability = unavailability of $FIG_j$;
      if($FIG_j$_unavailability > $F_j$_unavailability_constraint){
      return $F_j$_allocation_failure;
      break;}
  }
  return success;
}
```

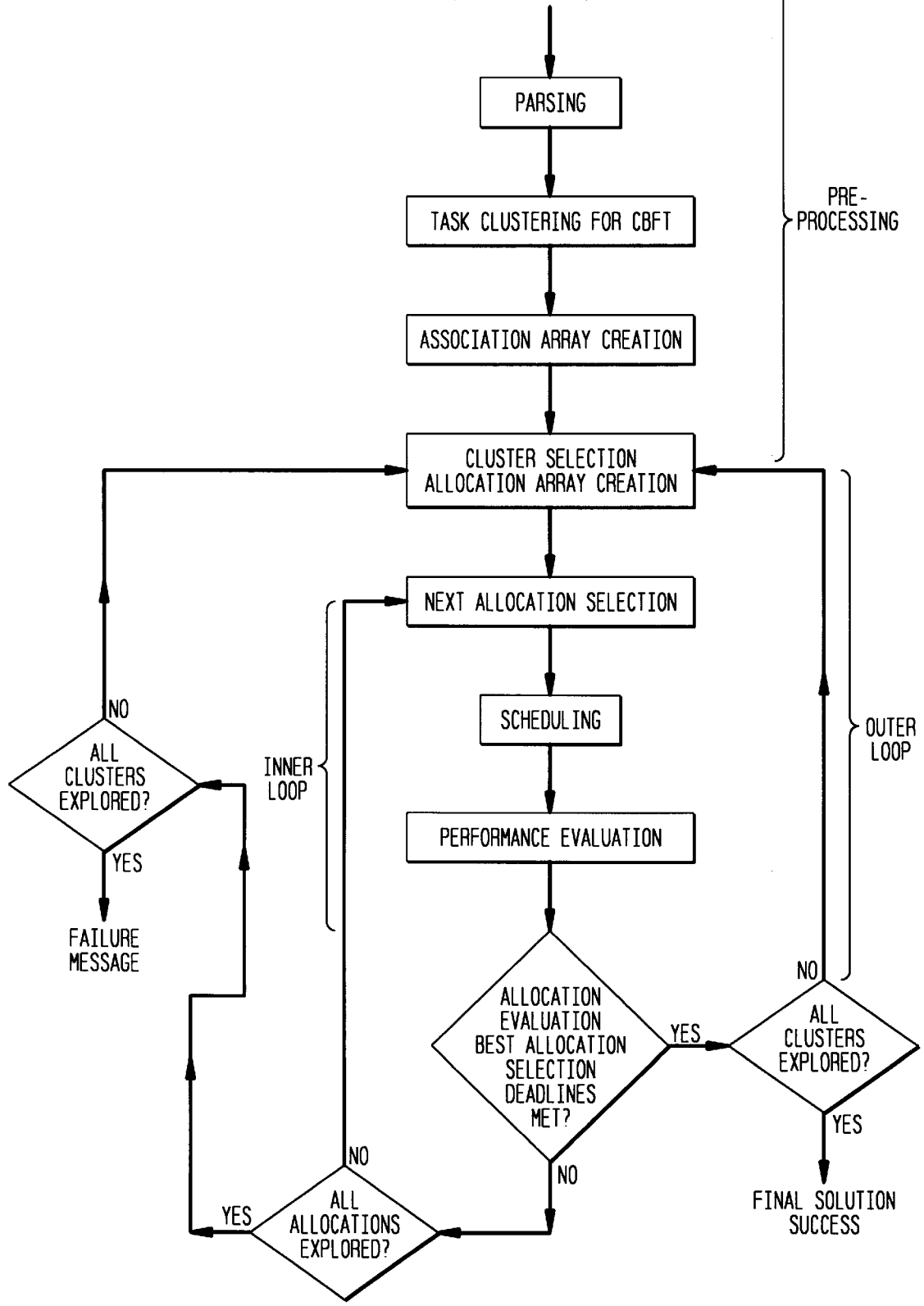

FIG. 16

```
COFTA(task graphs, resource library, constraints, $\tau^d$, MTTR){
  assign deadline-based priority levels;
  ASSIGN_ASSERTION_OVERHEADS(task graphs);
  ASSIGN_FT_LEVELS(task graphs);
  cluster_list←CLUSTERING_FOR_CBFT(task graphs, $\tau^d$);
  form an association_array for each task graph;
  sorted_cluster_list←sort clusters in the order of decreasing priority levels;
  for each cluster in sorted_cluster_list{
    cluster_tag=UNALLOCATED;}
  partial_architecture = NULL;
  ALLOCATE_CLUSTERS(sorted_cluster_list, partial_architecture){
    for each unallocated cluster $C_i$ from sorted_cluster_list{
      form allocation_array for cluster $C_i$;
      for each allocation {
        eliminate inter-cluster check tasks which are not needed;
        //allocation of multiple clusters to the same PE provides an oppurtunity for
        //assertion elimination if $\tau^d$ is not exceeded
        schedule allocated clusters;
        performance evaluation;
        //performs finish time, fault detection latency, and dependability analysis
        //assertion and duplicate-and-compare tasks may be added or deleted based on the schedule
        ASSERTION_SHARING(architecture, task graphs, $\tau^d$);
        DEFINE_ERROR_RECOVERY_TOPOLOGY)architecture,
          list_of_architecture_hints_for_FG, task graphs);
        EVALUATE_ARCHITECTURE_DEPENDABILITY(architecture, task graphs,
          list_of_failure_groups, list_of_function_unavailability_constraints, MTTR);
        if(deadline in the best case and unavailability constraints are met){
          partial_architecture = current_allocation;
          break;}
        else {
          partial_architecture = best allocation;}
      }
      cluster_tag($C_i$) = ALLOCATED;}
    }
  }
  return final_solution = partial_architecture;
}
```

COST=100

COST=150

COST=150

COST=265

COST=275

COST=315

COST=365

COST=380

COST=380

TABLE 1: FIT rates for major hardware/software modules

| No. | Modules | FIT Rate |
|---|---|---|
| 1 | Optical TX/RX module | 3607 |
| 2 | Electrical receiver module | 1137 |
| 3 | Boot ROM 1M bits | 71 |
| 4 | DRAM 16M bits | 43 |
| 5 | Microprocessor | 130 |
| 6 | Bipolar IC | 47 |
| 7 | Crystal oscillator | 60 |
| 8 | Opto-isolator | 300 |
| 9 | IC | 100 |
| 10 | FPGA | 80 |
| 11 | On-board power module | 250 |
| 12 | SRCTL | 3307 |
| 13 | SWM | 2363 |
| 14 | DS3STS1M | 2658 |

TABLE 2: Fault-secure telecom transport system architectures

| Example/ (No. of tasks) | Simplex architectures | | | Fault security using TBFT | | | DMR Cost ($) | Fault security using CBFT and assertion sharing | | | | |
|---|---|---|---|---|---|---|---|---|---|---|---|---|
| | No. of PEs/ links | Cost ($) | CPU time (sec) | No. of PEs/ links | Cost ($) | CPU time (sec) | | No. of PEs/ links | Cost ($) | CPU time (sec) | Savings over DMR(%) | Savings over TBFT(%) |
| DCS1/(11) | 4/2 | 129 | 0.42 | 6/3 | 159 | 0.50 | 258 | 5/3 | 140 | 0.58 | 45.7 | 11.9 |
| DCS2/(14) | 6/2 | 379 | 0.60 | 9/4 | 444 | 0.72 | 758 | 7/3 | 398 | 0.81 | 47.5 | 10.4 |
| D3IP1/(15) | 5/2 | 428 | 0.58 | 7/3 | 644 | 0.68 | 856 | 6/2 | 490 | 0.76 | 42.8 | 23.9 |
| D3IP2/(64) | 22/8 | 1768 | 1.98 | 27/12 | 2696 | 2.40 | 3536 | 26/9 | 2041 | 3.08 | 42.3 | 24.3 |
| ATM1/(18) | 4/2 | 870 | 0.60 | 7/4 | 1095 | 0.75 | 1740 | 6/4 | 922 | 0.80 | 47.0 | 15.8 |
| ATM2/(42) | 8/5 | 1470 | 1.20 | 11/7 | 1885 | 1.56 | 2940 | 10/7 | 1539 | 1.94 | 47.7 | 18.4 |
| ATM3/(90) | 18/9 | 2660 | 3.78 | 22/11 | 3445 | 5.40 | 5320 | 20/10 | 2818 | 5.74 | 47.0 | 18.2 |
| ATM4/(168) | 42/18 | 5280 | 152.00 | 45/20 | 6765 | 211.00 | 10560 | 44/20 | 5546 | 249.00 | 47.5 | 18.0 |
| OAS1/(22) | 8/3 | 2900 | 0.80 | 10/4 | 3473 | 0.91 | 5800 | 10/4 | 3372 | 1.12 | 41.9 | 2.9 |
| OAS2/(34) | 4/2 | 369 | 0.64 | 6/4 | 439 | 0.73 | 738 | 5/3 | 405 | 0.79 | 45.1 | 7.7 |
| OAS3/(52) | 14/5 | 6220 | 1.17 | 17/7 | 6576 | 1.68 | 12440 | 17/7 | 6389 | 2.10 | 48.6 | 2.8 |
| OAS4/(110) | 29/9 | 12150 | 270.45 | 31/11 | 12832 | 289.10 | 24300 | 31/11 | 12433 | 311.40 | 48.8 | 3.1 |
| OTSI/(52) | 8/6 | 2984 | 1.18 | 10/8 | 3695 | 1.35 | 5968 | 9/7 | 3115 | 1.42 | 47.8 | 15.7 |
| RDMX/(142) | 12/8 | 5290 | 106.70 | 14/10 | 6280 | 118.41 | 10580 | 13/10 | 5609 | 124.62 | 47.0 | 10.7 |
| OLS/(208) | 18/8 | 7359 | 392.45 | 22/11 | 11075 | 438.27 | 14718 | 20/10 | 8240 | 447.18 | 44.0 | 25.6 |
| ATSI/(272) | 16/9 | 20315 | 1168.52 | 22/12 | 30065 | 1208.54 | 40630 | 18/11 | 22988 | 1221.14 | 43.4 | 23.5 |
| BDCS/(396) | 22/10 | 14525 | 2980.52 | 25/14 | 19318 | 3134.62 | 29050 | 24/12 | 15115 | 3218.61 | 48.0 | 21.8 |
| ATMI/(482) | 40/14 | 26138 | 3212.47 | 47/19 | 33450 | 3288.46 | 52276 | 44/16 | 27150 | 3309.41 | 48.1 | 18.8 |
| NGCS/(568) | 35/12 | 22625 | 3895.74 | 40/15 | 28100 | 3980.51 | 45250 | 39/14 | 24214 | 4062.34 | 46.5 | 13.8 |
| AMTSI/(796) | 34/10 | 28660 | 8448.52 | 39/15 | 33825 | 8618.95 | 57320 | 37/11 | 30385 | 8746.28 | 47.0 | 10.2 |
| BACTIF/(872) | 38/12 | 27180 | 27645.60 | 42/16 | 32349 | 27818.42 | 54360 | 40/14 | 29600 | 27954.89 | 45.5 | 8.5 |
| OASIF/(1096) | 46/18 | 31050 | 36804.90 | 52/22 | 34475 | 37465.74 | 62100 | 50/20 | 31915 | 37714.21 | 48.6 | 7.4 |
| SAMIF/(1189) | 75/38 | 26450 | 34118.10 | 83/42 | 31908 | 35462.42 | 52900 | 80/41 | 28750 | 35781.79 | 45.7 | 9.9 |
| STMSI/(1418) | 96/31 | 34680 | 39518.42 | 112/39 | 40304 | 41346.86 | 69360 | 110/38 | 36244 | 41456.21 | 47.7 | 10.1 |
| STS1R/(1672) | 118/54 | 24585 | 46565.79 | 150/68 | 30758 | 47356.19 | 49170 | 145/66 | 26109 | 47565.48 | 46.9 | 15.1 |
| STS3IF/(1896) | 144/60 | 38190 | 45891.18 | 164/72 | 45765 | 46214.38 | 76380 | 158/70 | 41035 | 46719.27 | 46.3 | 10.3 |
| RDSAM/(2172) | 286/68 | 40650 | 64176.64 | 318/74 | 49325 | 67198.38 | 81300 | 312/72 | 43385 | 68459.60 | 46.6 | 12.0 |

TABLE 3: Fault-tolerant telecom transport system architectures

| Example/ (No. of tasks) | Architectures without fault security | | | Fault tolerance using TBFT | | | TMR Cost ($) | Fault tolerance using CBFT and assertion sharing | | | | |
|---|---|---|---|---|---|---|---|---|---|---|---|---|
| | No. of PEs/ links | Cost ($) | CPU time (sec) | No. of PEs/ links | Cost ($) | CPU time (sec) | | No. of PEs/ links | Cost ($) | CPU time (sec) | Savings over TMR(%) | Savings over TBFT(%) |
| DCS1/(11) | 4/2 | 129 | 0.42 | 10/6 | 388 | 0.58 | 387 | 9/6 | 316 | 0.60 | 18.3 | 18.6 |
| DCS2/(14) | 6/2 | 379 | 0.60 | 18/6 | 915 | 1.16 | 1137 | 14/6 | 822 | 1.24 | 27.7 | 10.2 |
| D3IP1/(15) | 5/2 | 428 | 0.58 | 15/6 | 1380 | 0.91 | 1284 | 14/5 | 1060 | 1.04 | 17.4 | 23.2 |
| D3IP2/(64) | 22/8 | 1768 | 1.98 | 31/18 | 3460 | 3.48 | 5304 | 28/16 | 2638 | 5.14 | 50.3 | 23.8 |
| ATM1/(18) | 4/2 | 870 | 0.60 | 16/8 | 2305 | 1.10 | 2610 | 14/8 | 1928 | 1.14 | 26.1 | 16.4 |
| ATM2/(42) | 8/5 | 1470 | 1.20 | 24/12 | 3205 | 2.60 | 4410 | 22/12 | 2617 | 2.75 | 40.7 | 18.3 |
| ATM3/(90) | 18/9 | 2660 | 3.78 | 29/15 | 4995 | 9.20 | 7980 | 27/14 | 4005 | 9.60 | 49.8 | 19.8 |
| ATM4/(168) | 42/18 | 5280 | 152.00 | 51/26 | 8745 | 250.80 | 15840 | 51/26 | 7271 | 257.60 | 54.1 | 16.9 |
| OAS1/(22) | 8/3 | 2900 | 0.80 | 16/8 | 6576 | 1.48 | 8700 | 16/8 | 6389 | 1.48 | 26.6 | 2.8 |
| OAS2/(34) | 4/2 | 369 | 0.64 | 11/8 | 907 | 0.84 | 1107 | 10/6 | 847 | 0.89 | 23.5 | 6.6 |
| OAS3/(52) | 14/5 | 6220 | 1.17 | 23/11 | 9684 | 2.42 | 18660 | 23/11 | 9401 | 2.48 | 49.6 | 2.9 |
| OAS4/(110) | 29/9 | 12150 | 270.45 | 36/15 | 16740 | 487.20 | 36450 | 36/15 | 16070 | 487.60 | 55.9 | 4.0 |
| OTSI/(52) | 8/6 | 2984 | 1.18 | 14/10 | 5334 | 1.74 | 8952 | 12/9 | 4145 | 1.86 | 53.7 | 22.3 |
| RDMX/(142) | 12/8 | 5290 | 106.70 | 16/12 | 9575 | 125.91 | 15870 | 15/12 | 7485 | 138.69 | 52.8 | 21.8 |
| OLS/(208) | 18/8 | 7359 | 392.45 | 24/14 | 13119 | 468.71 | 22077 | 22/14 | 11250 | 512.18 | 49.0 | 14.2 |
| ATSI/(272) | 16/9 | 20315 | 1168.52 | 26/16 | 34335 | 1234.54 | 60945 | 24/14 | 27965 | 1286.74 | 54.1 | 18.6 |
| BDCS/(396) | 22/10 | 14525 | 2980.52 | 28/18 | 21950 | 3346.20 | 43575 | 26/16 | 17880 | 3519.83 | 59.0 | 18.5 |
| ATMI/(482) | 40/14 | 26138 | 3212.47 | 54/24 | 38675 | 3508.15 | 78414 | 51/22 | 34786 | 3678.92 | 55.6 | 10.1 |
| NGCS/(568) | 35/12 | 22625 | 3895.74 | 44/19 | 36500 | 4218.56 | 67875 | 42/16 | 28960 | 4531.28 | 57.3 | 20.7 |
| AMTSI/(796) | 34/10 | 28660 | 8448.52 | 45/16 | 46150 | 8824.91 | 85980 | 40/14 | 38785 | 8918.16 | 54.9 | 16.0 |
| BACTIF/(872) | 38/12 | 27180 | 27645.60 | 48/20 | 39924 | 28464.25 | 81540 | 46/16 | 34775 | 29842.19 | 57.4 | 12.9 |
| OASIF/(1096) | 46/18 | 31050 | 36804.90 | 59/26 | 48125 | 38385.19 | 93150 | 55/22 | 38245 | 39168.46 | 58.9 | 20.5 |
| SAMIF/(1189) | 75/38 | 26450 | 34118.10 | 94/46 | 35910 | 35991.67 | 79350 | 90/46 | 32350 | 37816.48 | 59.2 | 9.9 |
| STMSI/(1418) | 96/31 | 34680 | 39518.42 | 120/42 | 42984 | 43454.60 | 104040 | 116/41 | 38778 | 43786.19 | 62.7 | 9.8 |
| STS1R/(1672) | 118/54 | 24585 | 46565.79 | 156/72 | 31954 | 49168.74 | 73755 | 150/68 | 27185 | 51159.46 | 63.1 | 14.9 |
| STS3IF/(1896) | 144/60 | 38190 | 45891.18 | 168/80 | 48784 | 48354.33 | 114570 | 166/74 | 43764 | 50845.81 | 61.8 | 10.3 |
| RDSAM/(2172) | 286/68 | 40650 | 64176.64 | 334/78 | 53740 | 69948.21 | 121950 | 328/78 | 46415 | 71856.64 | 61.9 | 13.6 | ns

HARDWARE-SOFTWARE CO-SYNTHESIS OF HETEROGENEOUS DISTRIBUTED EMBEDDED SYSTEMS FOR LOW OVERHEAD FAULT TOLERANCE

CROSS-REFERENCES TO RELATED APPLICATIONS

This nonprovisional U.S. national application, filed under 35 U.S.C. § 111(a), claims, under 35 U.S.C. §119(e)(1), the benefit of the filing dates of (1) provisional U.S. national application No. 60/038,488, filed under 35 U.S.C. §111(b) on Feb. 24, 1997 (2) provisional U.S. national application No. 60/038,934, filed under 35 U.S.C. §111(b) on Feb. 24, 1997 and (3) provisional U.S. national application No. 60/054,709, filed under 35 U.S.C. §111(b) on Aug. 4, 1997, the teachings of all three of which are incorporated herein by reference.

This application is one of the set of U.S. patent applications consisting of Ser. Nos. 09/024,604, 09/024,605, 09/025,537, 09/024,839, 09/025,097 and 09/024,762, all of which share the same filing date and the teachings of all of which are incorporated herein by reference.

BACKGROUND OF THE INVENTION

1. Field of the Invention

The present invention relates to the design of real-time distributed embedded systems, and, in particular, to the process of partitioning an embedded system specification into hardware and software modules using hardware-software co-synthesis.

2. Description of the Related Art

Embedded systems have begun to play a significant role in our day-to-day lives. Fault-tolerant distributed embedded systems can offer high performance as well as reliability and availability to meet the needs of critical real-time applications. Many embedded systems concurrently perform a multitude of complex tasks. Heterogeneous distributed architectures are commonly used to meet the performance needs for such systems. These architectures contain several general-purpose processors and application-specific integrated circuits (ASICs) of different types which are interconnected by various types of communication links. Each task to be performed on the system can be executed on a variety of software and hardware modules which have different dollar costs, reliability, area, delay, and power requirements. For example, a task can be performed on a general-purpose processor (software) or an ASIC (hardware). Similarly, a message can be communicated via a serial link, local area network (LAN), or a bus. Parameters such as area, delay, reliability, and power are usually estimated by simulation/synthesis or laboratory measurement from previous designs.

The derivation of an optimal hardware-software architecture requires selection of processors, ASICs, and communication links such that all real-time, reliability, and availability constraints are met and the architecture cost is minimum. The key steps of hardware-software co-synthesis are: a) allocation, b) scheduling, and c) performance estimation. The allocation step identifies mapping of tasks to processing elements (PEs) and inter-task communications to communication links. The scheduling step determines the order of execution of tasks and edges on PEs and links, respectively. The performance estimation step estimates the finish time of each task and determines the overall quality of the system in terms of its dollar cost, fault tolerance, reliability, availability, etc. Both allocation and scheduling are known to be NP-complete. See References (1)–(2). Therefore, optimal co-synthesis is a computationally hard problem.

Research on hardware-software co-synthesis is fairly recent and its primary focus has been on one-CPU-one-ASIC architectures. See References (3)–(8). Distributed embedded system architectures can employ multiple processors, ASICs, and field-programmable gate arrays (FPGAs). See Reference (9). Optimal (see References (10)–(11)) and heuristic (see References (12)–(16)) are two major approaches to solve the distributed system co-synthesis problem. Mixed integer linear programming (MILP) and exhaustive are two distinct optimal approaches. Prakash and Parker have proposed MILP-based co-synthesis (see Reference (10)) which has the following limitations: 1) it allows only one task graph, 2) it does not allow preemptive scheduling, 3) it requires specifications of interconnection topology up front, and 4) it does not consider fault tolerance. Due to computational complexity, it is only suitable for small task graphs consisting of about 10 tasks. Ambrosio and Hu have proposed a configuration-level hardware-software partitioning algorithm (see Reference (11)) which is based on an exhaustive enumeration of all possible solutions. Limitations of this approach are: 1) it allows an architecture with at most one CPU and few ASICs, 2) it ignores communication overheads, 3) it does not consider fault tolerance, and 4) it uses simulation for performance evaluation which is very time-consuming.

Iterative (see References (12)–(14)) and constructive (see References (15)–(16)) are two distinct approaches in the heuristic domain. In the iterative approach, an initial solution is iteratively improved through various architecture moves. In the constructive approach, the architecture is built step-by-step and the complete architecture is not available before completion of the algorithm. The iterative procedures given in References (12)–(13) do not address fault tolerance and consider only one type of communication link. They do not allow mapping of successive instances of a periodic task to different PEs, which may be important in deriving cost-effective architectures. The algorithm in Reference (14) employs power dissipation as a cost function for allocation. It ignores inter-task communication scheduling. A constructive co-synthesis algorithm for fault-tolerant distributed embedded systems has been proposed in Reference (15). The method in Reference (15) has the following limitations: 1) it employs task-based fault tolerance (TBFT) (see Reference (17)), but does not exploit the error transparency property (explained later) which can significantly reduce the fault tolerance overhead, 2) it does not support communication topologies such as bus, LAN, etc., 3) it employs a pessimistic finish time estimation technique which may increase the architecture cost, 4) it does not address availability of systems, and 5) it is not suitable for multirate systems. The primary focus in Reference (16) is on general and low-power co-synthesis of distributed embedded systems. The methods in Refierences (18)–(21) consider fault tolerance during task allocation, but not during co-synthesis. Direct optimization of dependability (reliability and availability) or determination of an efficient error recovery topology of the architecture has not been attempted before during co-synthesis. Also, the concepts of multidimensional assertions and assertion sharing have not been exploited before.

SUMMARY OF THE INVENTION

The present invention is related to a heuristic-based constructive co-synthesis algorithm, called COFTA (Cosynthesis Of Fault-Tolerant Architectures), which produces an optimized distributed embedded system architecture for fault tolerance. Fault detection is accomplished through the addition of assertion and duplicate-and-compare tasks. A new task clustering technique exploits the transparency of some tasks to errors to reduce the fault tolerance overhead, and determines the best placement of assertion and/or duplicate-and-compare tasks. Concepts of multidimensional assertions and assertion sharing are introduced to further reduce the fault tolerance overhead. The best error recovery topology is automatically extracted during co-synthesis. Error recovery is accomplished through a few spare PEs. Markov models are used to evaluate the availability of the architecture. It is the first algorithm to optimize dependability during co-synthesis. In order to establish its effectiveness, COFTA has been successfully applied to a large number of real-life telecom transport system examples.

In one embodiment, the present invention is a method for designing the architecture of an embedded system, comprising a pre-processing phase and a synthesis phase. The pre-processing phase comprises the steps of (1) parsing one or more task graphs, one or more system/task constraints, and a resource library for the embedded system; and (2) assigning one or more fault detection tasks to one or more original tasks in the tasks graphs to enable the embedded system to perform fault detection for the one or more original tasks. The synthesis phase, following the pre-processing phase, comprises the step of allocating the fault detection tasks and one or more groups of one or more original tasks to one or more processing elements in the resource library and allocating one or more edges in the tasks graphs to one or more communication links in the resource library, based on performance evaluation of one or more possible allocations for each of the groups, edges, and fault detection tasks in light of the system/task constraints.

In an alternative embodiment, the present invention is a method for designing the architecture of an embedded system, comprising a pre-processing phase, a synthesis phase, and an error recovery topology derivation phase. The pre-processing phase comprises the step of parsing one or more task graphs, one or more system/task constraints, and a resource library for the embedded system. The synthesis phase, following the pre-processing phase, comprises the step of allocating one or more groups of one or more tasks in the tasks graphs to one or more processing elements in the resource library and allocating one or more edges in the tasks graphs to one or more communication links in the resource library, based on performance evaluation of one or more possible allocations for each of the groups and edges in light of the system/task constraints. The error recovery topology derivation phase comprises the step of deriving an error recovery topology for the embedded system by defining one or more failure groups, wherein each failure group comprises one or more service modules, one or more protection modules, and one or more switches for substituting a protection module for a service module, if a permanent error is detected in the service module.

In another alternative embodiment, the present invention is a method for designing the architecture of an embedded system, comprising a pre-processing phase and a synthesis phase. The pre-processing phase comprises the step of parsing one or more task graphs, one or more system/task constraints including one or more unavailability constraints, and a resource library for the embedded system. The synthesis phase, following the pre-processing phase, comprises the step of allocating one or more groups of one or more tasks in the tasks graphs to one or more processing elements in the resource library and allocating one or more edges in the tasks graphs to one or more communication links in the resource library, based on performance evaluation of one or more possible allocations for each of the groups and edges in light of the system/task constraints, wherein the performance evaluation includes determining whether one or more system unavailability constraints are met.

BRIEF DESCRIPTION OF THE DRAWINGS

Other aspects, features, and advantages of the present invention will become more fully apparent from the following detailed description, the appended claims, and the accompanying drawings in which:

FIGS. 1(a)–(f) show an exemplary task graph, resource library, execution/communication vectors, initial priority levels, corresponding task graph with fault detection capability, and corresponding finish time estimate graph, respectively;

FIG. 4 shows the pseudo-code for the assertion overhead and fault tolerance level assignment procedures, according to one embodiment of the present invention;

FIG. 5 shows the pseudo-code for the clustering procedure for cluster-based fault tolerance, according to one embodiment of the present invention;

FIG. 6 shows the pseudo-code for the cluster expansion procedure, according to one embodiment of the present invention;

FIGS. 7(a)–(e) show an exemplary task graph, corresponding initial priority levels, fault detection overhead information, corresponding fault tolerance levels, and corresponding augmented task graph, respectively;

FIG. 8 shows the pseudo-code for the assertion sharing procedure, according to one embodiment of the present invention;

FIG. 11 shows the pseudo-code for the error recovery topology definition procedure, according to one embodiment of the present invention;

FIG. 12 shows the pseudo-code for the failure group creation procedure, according to one embodiment of the present invention;

FIGS. 13(a)–(e) demonstrate failure group identification;

FIG. 14 shows the pseudo-code for the architecture dependability evaluation procedure, according to one embodiment of the present invention;

FIG. 15 shows the co-synthesis process flow, according to one embodiment of the present invention;

FIG. 16 shows the pseudo-code for the COFTA procedure;

Figure 1F:
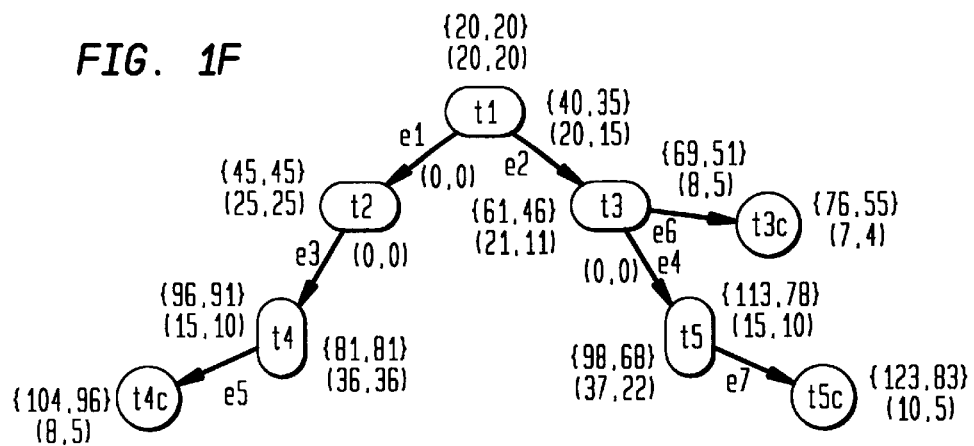

Table 1 shows failure-in-time rates for major hardware/software modules;

Table 2 shows fault-secure telecom transport system architectures; and

Table 3 shows fault-tolerant telecom transport system architectures.

DETAILED DESCRIPTION

1 The Co-Synthesis Framework

Each application-specific function of an embedded system is made up of several sequential and/or concurrent jobs. Each job is made up of several tasks. Tasks are atomic units performed by embedded systems. Tasks contain both data as well as control flow information. The embedded system functionality is usually described through a set of task graphs. Nodes of a task graph represent tasks. Tasks communicate data to each other, indicated by a directed edge between communicating tasks. Task graphs can be periodic or aperiodic. Although this specification focuses primarily on periodic task graphs, the present co-synthesis algorithm can be easily extended to cover aperiodic tasks as well, using the concepts in Reference (22). Each periodic task graph has an earliest start time (EST), period, and deadline, as shown for an example in FIG. 1(a). Each task of a periodic task graph inherits the graph's period. Each task in a task graph can have a different deadline.

The PE (link) library is a collection of all available PEs (communication links). The PE and link libraries together form the resource library. The resource library and its costs for two general-purpose processors, P1 and P2, two ASICs, ASIC1 and ASIC2, and two links, L1 and L2, are shown in FIG. 1(b). The following definitions form the basis of the co-synthesis framework. Some of these definitions have been taken from Reference (16).

Definition 1: Execution_vector($t_i$)=$\{\pi_{i1}, \pi_{i2}, \ldots, \pi_{in}\}$ is the execution vector of task $t_i$, where $\pi_{ij}$ indicates the execution time of task $t_i$ on PEj from the PE library. $\pi^{min}(t_i)$ and $\pi^{max}(t_i)$ denote the minimum and maximum execution times in this vector, respectively. Execution vectors for the tasks in the task graph of FIG. 1(a) are given in FIG. 1(c).

Definition 2: Preference_vector($t_i$)=$\{\wp_{i1}, \wp_{i2}, \ldots, \wp_{in}\}$ is the preference vector of task $t_i$, where $\wp_{ij}$ indicates preferential mapping for task $t_i$. If $\wp_{ij}$ is 0, it indicates that $t_i$ cannot be executed on PEj, and 1 if there are no constraints. This vector is useful in cases where preferred allocation is determined based on prior experience or task characteristics.

Definition 3: Exclusion_vector($t_i$)=$\{\chi_{i1}, \chi_{i2}, \ldots, \chi_{iq}\}$ is the exclusion vector of task $t_i$, which specifies which tasks can co-exist with $t_i$ on the same PE. $\chi_{ij}=1$ indicates that tasks $t_i$ and $t_j$ have to be allocated to different PEs, and $\chi_{ij}=0$ indicates there are no constraints.

Definition 4: A cluster of tasks is a group of tasks that are always allocated to the same PE. Clustering of tasks in a task graph reduces the communication times and significantly speeds up the co-synthesis process.

Definition 5: Preference_vector($C_k$) of cluster $C_k$ is the bit-wise logical AND of preference vectors of all tasks in the cluster. This vector indicates which PEs the cluster cannot be allocated to.

Definition 6: Exclusion_vector($C_k$) of cluster $C_k$ is the bit-wise logical OR of exclusion vectors of all the tasks in the cluster.

Definition 7: Task $t_i$ is said to be preference-compatible with cluster $C_k$ if the bit-wise logical AND of the preference vector of cluster $C_k$ and task $t_i$ does not result in the zero-vector (a vector with all elements zero). If all elements of a preference vector of cluster $C_k$ are zero, it makes the cluster unallocatable to any PE.

Definition 8: Task $t_i$ is said to be exclusion-compatible with cluster $C_k$ if the ith entry of the exclusion vector of $C_k$ is zero. This indicates that tasks in cluster $C_k$ can be co-allocated with task $t_i$. If $t_i$ is both preference- and exclusion-compatible with $C_k$, it is simply said to be compatible with $C_k$.

Definition 9: Task $t_j$ is said to be error-transparent if an error at its input always propagates to its outputs. If task $t_i$ feeds an error-transparent task $t_j$, whose output can be checked with an assertion task, then there is no need to have an assertion task or duplicate-and-compare tasks to check the output of $t_i$. This reduces the fault tolerance overhead. Many tasks in real-life task graphs do have the error transparency property. For example, a task graph for telecom input interface processing consists of the following tasks in a chain: pre-amplification, timing recovery, bipolar decoding, framing, and payload processing. All these tasks are error-transparent, and one assertion task at the output of the chain suffices for fault detection purposes if the fault detection latency requirement (explained later) is satisfied.

Definition 10: Communication_vector($e_j$)=$\{\psi_{j1}, \psi_{j2}, \ldots, \psi_{jm}\}$ is the communication vector of edge $e_j$, where $\psi_{jl}$ indicates the time it takes to communicate the data on edge $e_j$ on communication link l. $\psi^{min}(e_j)$ and $\psi^{max}(e_j)$ denote the minimum and maximum communication times in this vector, respectively.

Definition 11: The access_time_vector(l)=$\{\Omega_{l1}, \Omega_{l2}, \ldots, \Omega_{ls}\}$ is an access time vector for link l, where $\Omega_{lr}$ represents the access time per packet with r ports on link l.

As mentioned before, a communication link can take different forms such as point-to-point, bus, LAN, etc. This is taken into consideration through the communication vector. The communication vector for each edge is computed a priori for various types of links as follows. Let $\rho_k$ be the number of bytes that need to be communicated on edge $e_k$, and $\alpha_l$ be the number of bytes per packet that link l can support, excluding the packet overhead. Suppose the link under consideration, l, has s ports. Let $\tau_l$ be the communication time of a packet on link l. Then $\Omega_{kl}$ is given by:

$$\psi_{kl} = \lceil (\rho_k) \div (\alpha_l) \rceil \cdot (\tau_l + \Omega_{ls})$$

The link access overhead per packet can be reduced in case of large messages requiring multiple packets. At the beginning of co-synthesis, since the actual number of communication ports on the links is not known, an average number of communication ports (specified a priori) is initially used to determine the communication vector. This vector is recomputed after each allocation, considering the actual number of ports on the link. The communication vectors of edges in the task graph of FIG. 1(a) on the elements of the link library are given in FIG. 1(c).

The memory architecture of embedded systems plays an important role from performance and cost point of view. Storage requirements are of different types: program storage, data storage and stack storage.

Definition 12: The memory vector of task $t_i$ is defined as: memory_vector($t_i$)=$\{$program_storage($t_i$), data_storage($t_i$), stack_storage($t_i$)$\}$. For each allocation, it is checked whether the available memory capacity has been exceeded.

Definition 13: The assertion_excess_overhead_vector ($\alpha_k$)=$\{\sigma_{k1}, \sigma_{k2}, \ldots, \sigma_{kp}\}$ is the assertion excess overhead vector of assertion task $\alpha_k$, where $\sigma_{kr}$ indicates the excess overhead factor for sharing $\alpha_k$ among r tasks. In other words, each entry in execution_vector($\alpha_k$) is multiplied by $(1+\sigma_{kr})$ for such assertion tasks.

In order to provide flexibility for the communication mechanism, two modes of communication are supported: 1) sequential, where communication and computation cannot go on simultaneously and 2) concurrent, where communication and computation can go on simultaneously if supported by the associated communication link and PEs.

In general, tasks are reused across multiple embedded system functions. To exploit this fact, the concept of architectural hints is used. Architectural hints are created during task graph generation. They are based on the type of task, type of resource library, and previous experience of the designers. These hints are used to indicate possibilities of reuse, preemption, error recovery topology, etc. These hints are not necessary for the success of the present algorithm. However, it can exploit them when they are available.

In critical embedded system applications, the dependability of the system is of utmost concern. The measures of dependability are reliability and availability. Reliability is the ability of a system to perform the required functions for a specified period under stated mechanical, thermal, electrical, and other environmental conditions. The specified period is generally referred to as service life. In general, systems in operation allow repair scenarios for failed components. For example, most of the telecom embedded systems are designed for critical applications requiring continuous operation where repair operation is allowed. Availability is a measure of the fraction of time the system is available to perform the required functions. Generally, the maximum allowed unavailability (i.e., 1—availability) of the system is specified in units of minutes per year. Different embedded functions have different availability requirements. For example, in telecom systems, the availability of the control module may affect the availability of provisioning and communication to the system, but may not impact the transmission functions performed by the system. The term provisioning is generally used to describe embedded system functions such as configuration, addition of new services, etc. On the other hand, the failure of the transmission module may not impact the availability of the control function, but it may impact service and generally has a more stringent availability requirement, compared to that of a control module. Thus, it is assumed that each task graph $T_i$ has an allowed unavailability specified a priori in terms of $U_i$ minutes/year.

An embedded system architecture generally has several interconnected modules. A module is defined as an interconnection of several elements from the resource library to perform a specific set of functions. Elements of the resource library are also sometimes referred to as components. In order to meet availability requirements for various task graphs of the system, a failure group is formed, which is a collection of service and protection modules. In the event of failure of any service module, a switch to the protection module is required for efficient error recovery.

Failure-in-time (FIT) rate $\lambda$ of a component or system is the expected number of its failures in a given time period. In order to facilitate unavailability analysis of the architecture, the FIT rate for each hardware and software module and mean-time to repair (MTTR) of a faulty module are assumed to be specified a priori, in addition to the system's availability requirements. The FIT rate of a module/component indicates its expected number of failures in $10^9$ hours of operation. For each failure group, background diagnostics are run on the protection (also known as stand-by) module to increase its availability in the event of a protection switch. Background diagnostics either consist of a separate set of tasks specified a priori or the allocated tasks to the failure group.

Traditionally, for fault tolerance purposes, either an assertion task is added to check the output of each task or the task is duplicated and a comparison task is added to compare the outputs of the duplicated tasks. An assertion task checks some inherent property/characteristic of the output data from the original task. See Reference (17). If that property is not satisfied, it flags the output data as erroneous. Some common examples of assertion tasks used in telecom transport systems are: a) parity error detection, b) address range check, c) protection switch control error detection, d) bipolar-violation detection, e) checksum error detection, f) frame error detection, g) loss-of-synchronization detection, h) software code checksum error detection, i) software input and output data constraints check, etc. For each task, it is specified whether one or more assertion tasks for it are available or not. For each assertion, an associated fault coverage is specified. A combination of assertions may sometimes be required to achieve the desired fault coverage. For each such task, a group of assertions and the location of each assertion is specified. For each check (assertion or compare) task, the execution vector and the communication vector of the edge between the checked and check tasks are specified.

For each available processor, its cost, FIT rate, supply voltage, average quiescent power dissipation, peak power constraint, and associated peripheral attributes, such as memory architecture, processor-link communication characteristics, and cache characteristics, are assumed to be specified. In addition, the preemption overhead for each processor is specified a priori along with its execution time as well as average and peak power consumption. For each ASIC, its cost, supply voltage, average quiescent power dissipation, and package attributes, such as available pins, available gates, and FIT rate, are assumed to be specified. Similarly, for each FPGA, its cost, supply voltage, average quiescent power dissipation, FIT rate, as well as package attributes such as available pins and maximum number of programmable functional units (PFUs) are assumed to be specified. Generally, all PFUs are not usable due to routing restrictions. A very high utilization of PFUs and pins may force the router to route the nets such that it may exceed the execution time (delay constraint) defined by the execution vector. This is taken into account through a term called the effective usage factor (EUF). Based on previous design experience, an EUF of 70% was assumed for the experimental results to determine the percentage of the logical blocks that are actually usable for allocation purposes. The user is also allowed to specify an EUF based on his/her own experience. The user can also specify the effective pin usage factor (EPUF) to indicate what percentage of package pins can be used for allocation (default is 80% to allow pins for power, ground, and due to routing restrictions). The default percentages used for EUF and EPUF were derived based on existing designs, and experimentally verified to guarantee the satisfaction of delay constraints.

2 Low Overhead Fault Tolerance Schemes and Architecture Dependability

The embedded system architecture is made fault-secure using the concept of task-based fault tolerance (TBFT) against at least single PE faults. See Reference (17). The link faults are addressed by traditional techniques such as data encoding, loss-of-signal detection, loss-of-clock detection, etc. A system is said to be fault-secure, if in the presence of a fault, either transient or permanent, the system either detects it or always gives the correct output. See Reference (23). In Reference (24), task redundancy (such as duplicate-and-compare or triplicate-and-vote) is used for fault detection and tolerance. However, relying on task duplication alone for fault security results in large overheads in cost and power consumption. As described later in this specification, the use of assertion tasks can substantially lower these overheads. For error recovery, once the fault is detected through a check task and determined to be permanent (explained later), the service module on which the checked task resides is marked faulty, and tasks allocated to that module are run on a standby protection moduile. In many large distributed embedded systems, there are several modules of the same type which perform identical functions on different input data. For example, in a transport system for processing N OC-192 (9.92 Gb/s synchronous optical network transport (SONET)) signals, there would typically be N service modules, each processing one OC-192 signal. In this case, each module is designed to execute the same set of tasks. The present algorithm uses one protection module for every failure group consisting of N service modules in order to minimize the fault tolerance overhead, whenever possible.

2.1 Cluster-Based Fault Tolerance

Figure 2A:
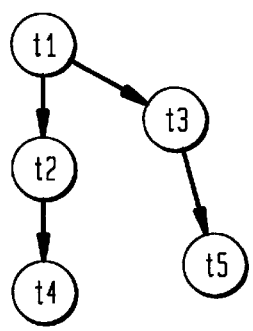
FIGS. 2(a)–(c) shows task graphs that demonstrate cluster-based fault tolerance.
Figure 2B:
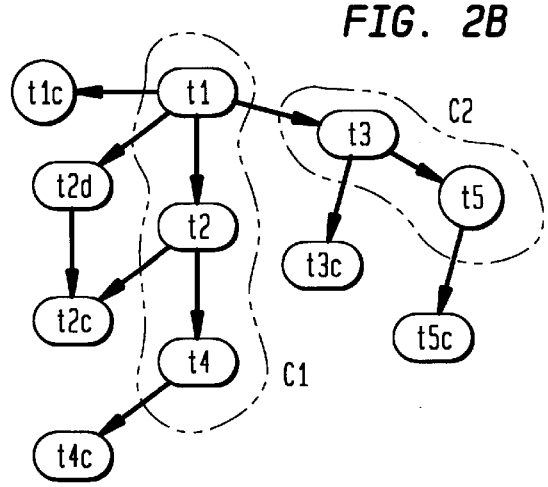
Figure 2C:
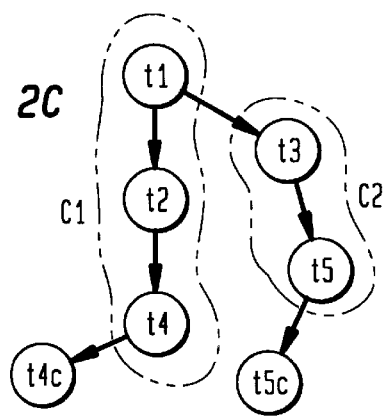

In order to exploit the error transparency concept properly, the present algorithm uses the concept of cluster-based fault tolerance (CBFT). To illustrate its advantages, consider the task graph shown in FIG. 2(a). Assume that an assertion task is available for all tasks except task t2. Application of the TBFT concept (see References (15) and (17)) results in an augmented task graph shown in FIG. 2(b). Since task t2 does not have an assertion, its duplicate task t2d and compare task t2c are added. For each of the remaining tasks, an assertion task is added, e.g., t1c for t1, and so on. Application of the clustering procedure (given later) results in the clusters shown in FIG. 2(b). This means, for example, that tasks t1, t2, and t4 belonging to cluster C1 will be allocated to the same PE. Any transient or permanent fault in the PE may affect any one or more of these tasks. Suppose tasks t2, t4, and t5 are error-transparent. Then t1c, t2d, t2c, and t3c can be dropped from the augmented task graph, obtaining the graph shown in FIG. 2(c). Suppose the fault in the PE that cluster C1 is allocated to affects task t1; then the corresponding error will be propagated to t4c and detected by it. A fault affecting task t2 or task t4 will similarly be detected by t4c. The algorithm makes sure that a checked task and its check task are allocated to different PEs using the exclusion vector concept so that a single PE fault does not affect both. Similarly, a task and its duplicate, if one exists, are also allocated to different PEs.

2.1.1 Fault Detection Latency

In real-time systems, the fault detection latency (the time it takes to detect a fault) can significantly impact the protection switch time. The protection switch time includes the fault detection latency of the system and the error recovery time. Therefore, even when a task is error-trensparent, it may be necessary to add a check task to its input to improve the fault detection latency. The algorithm takes care of this concern as follows. Suppose the maximum allowable system fault detection latency is $\tau^d$. First, the fault detection latency is computed for each check task, as illustrated by the following example.

Figure 3A:
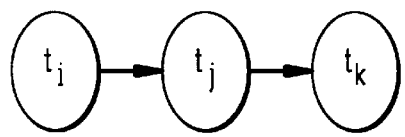
FIGS. 3(a)–(c) shows task graphs that demonstrate fault detection latency.
Figure 3B:
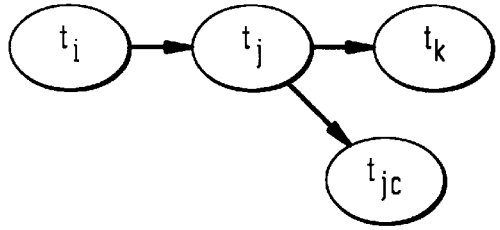
Figure 3C:
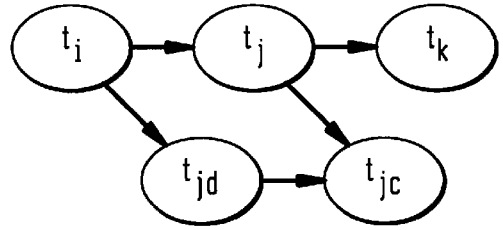

Consider the task graph in FIG. 3(a). Its augmented task graph with the addition of an assertion task and duplicate-and-compare tasks for task $t_j$ are shown in FIGS. 3(b) and 3(c), respectively. Suppose $t_j$ is error-transparent and $t_i$ and $t_k$ are not. The fault detection latency, $\tau^{jc}$, for check task $t_{jc}$ is equal to $\pi^{max}(t_i) + \psi^{max}(t_j, t_{jc}) + \pi^{max}(t_{jc})$. The assertion or duplicate-and-compare tasks of $t_i$ can be eliminated only if: 1) in addition to being error-transparent, task $t_j$ also has an assertion task, and 2) $\pi^{max}(t_i) + \psi^{max}(t_i, t_j) + \tau^{jc} \leq \tau^d$. If $t_j$ does not have an assertion and needs duplicate-and-compare, then $t_i$ can feed the same erroneous input patterns to both $t_j$ and $t_{jd}$, which will in turn result in the same erroneous values at the outputs of $t_j$ and $t_{jd}$, and the error will not be detected.

In this case, $t_i$'s output will need to be checked directly even though $t_j$ is error-transparent.

Let $\tau^{kc}$ be the fault detection latency of task $t_{kc}$, where $t_k$ has a set of input paths, M. Let $t_j$ be a task and $e_l$ be an edge on the jth path. The fault detection time, $\Phi_k$, at task $t_k$, is estimated using the following equation:

$$\Phi_k = \max_M \left( \sum_p \pi^{max}(t_j) + \sum_p \psi^{max}(e_l) \right) + \tau^{kc}$$

where $p \in M$, $j \neq k$, $e_l \in p$, and $t_j \in p$ from the last checked task. The execution and communication times on each path are summed after the last checked task on that path. The communication time on an inter-task edge between two tasks belonging to the same cluster is made zero (this is a traditional assumption in distributed computing).

2.1.2 Application of Error Transparency and Fault Detection Latency Properties to Task Clustering The algorithm uses a new task clustering technique to take advantage of error transparency, whenever possible, and to find the best placement of the assertion and duplicate-and-compare tasks as follows. Task clustering involves grouping of tasks to reduce the complexity of allocation. The present clustering technique addresses the fact that different paths may become the longest path through the task graph at different points in the clustering process since the length of the longest path changes after partial clustering. Experience from COSYN (see Reference (16)) shows that task clustering results in up to five-fold reduction in co-synthesis CPU time for medium-sized task graphs (with the number of tasks in the hundreds) with less than 1% increase in embedded system cost.

Since meeting the real-time constraints is the most important objective, the present algorithm first assigns a deadline-based priority level to each task and edge in each task graph in order to determine the ordering of tasks for clustering. See References (15)–(16). The priority level of a task (edge) is an indication of the longest path from the task (edge) to a task with a specified deadline, and includes the computation and communication times along the path as well as the deadline. A non-sink task $t_j$ may either have a deadline or not. $\beta(t_j)$ is defined to be equal to the deadline of $t_j$ if the deadline is specified, and $\infty$ otherwise. Then the priority level of a task and edge are determined as follows:

a. Priority level of sink task $t_i = \pi^{max}(t_i) - \text{deadline}(t_i)$.
b. Priority level of an edge $e_k$=priority level of destination node $(e_k) + \psi^{max}(e_k)$.
c. Priority level of non-sink task $t_j$=max(priority level of its fanout edge $e_f$, $-\beta(t_j)) + \pi^{max}(t_j)$.

Application of the above deadline-based priority level assignment procedure to the task graph in FIG. 1(a) results in the initial priority levels indicated by numbers next to nodes and edges in FIG. 1(d). In the beginning, the maximum communication time, $\psi^{max}(e_k)$, is used to compute the priority levels. However, as clustering progresses and the communication times get fixed to zero, the priority levels are recomputed at each step.

At the beginning of the clustering procedure an assertion overhead and fault tolerance (FT) level is also assigned to each task using the procedure given in FIG. 4. The FT level indicates the longest path from the task to a sink task considering the assertion overhead and communication. Like the priority levels, FT levels are also recomputed as clustering progresses.

The clustering method for CBFT is given in FIG. 5. The method uses priority levels to determine the order of tasks for clustering. However, the method uses FT levels to derive the most appropriate cluster as well as to identify the fan-out task along which to expand the cluster. During cluster formation, the method uses error transparency as well as allowable system fault detection latency to define the best placement of the assertion and duplicate-and-compare tasks.

For each unclustered task $t_i$, the method first forms a fan-in set, which is the set of compatible fan-in tasks. The method identifies the cluster $C_j$ of the task from the fan-in set with which $t_i$ can be clustered. If the fan-in set is empty, a new cluster is formed. Once task $t_i$ is clustered with cluster $C_j$, the EXPAND_CLUSTER procedure given in FIG. 6 is used to expand the cluster. In order to ensure load balancing among various PEs of the architecture, the cluster size should be limited. If the cluster size is too big, it may be prevented from being allocated to any PE. If it is too small, it would increase the total number of clusters and increase the computational complexity. A parameter called cluster size threshold, $C_{th}$, is used to limit the size of the cluster. $C_{th}$ is set equal to the hyperperiod which is the least common multiple of the periods of all task graphs. If $period_i$ is the period of task graph i then {hyperperiod÷$period_i$} copies for it need to be explicitly or implicitly tackled. See Reference (25). At any point in the clustering procedure, for any cluster $C_k$ containing m tasks $\{t_1,t_2, \ldots ,t_m\}$, its size, denoted as $\theta_k$, is estimated by the following equation:

$$\theta_k = \sum_{i=1}^{m} \pi^{\max}(t_i) \cdot (\Gamma \div p)$$

where p denotes the period of the tasks in cluster $C_k$ and $\Gamma$ is the hyperperiod.

To illustrate the clustering technique, consider the task graph in FIG. 7(a). Suppose there is only one PE and one link in the resource library. The numbers adjacent to nodes (edges) indicate their execution (communication) times and dl indicates the deadline. The initial priority levels are shown in FIG. 7(b). Suppose all tasks except task t12 are error-transparent and only tasks t3, t8, and t9 do not have assertions. The execution and communication times for assertion as well as duplicate-and-compare tasks, and assertion overheads are given in FIG. 7(c). The numbers adjacent to nodes in FIG. 7(d) indicate the associated initial FT levels. The application of the clustering procedure for CBFT to the task graph of FIG. 7(a) results in the clusters shown by enclosures in the augmented task graph shown in FIG. 7(e). The allowable system fault-detection threshold, $\tau^d$, is assumed to be 75. The fault detection time from t1 to t6c is 78 (summation of execution and communication times up to t6c; note that the communication time between t2 and t6 is 0 since they belong to the same cluster) which exceeds $\tau^d$. Therefore, an assertion task t2c is added at task t2. On the other hand, the duplicate-and-compare tasks for t3 are eliminated, since tasks t7 and t10 are error-transparent and $\tau^d$ is not exceeded. An assertion task is required at task t4, even though task t8 is error-transparent, since t8 does not have an assertion. Also, an assertion task is required at task t5 since: a) t9 is error-transparent, but does not have an assertion, and b) task t12 is not error-transparent. The priority and FT levels of tasks are recalculated after the clustering of each task to address the fact that there may be more than one critical path in the cluster and the critical path may change as tasks get clustered. As mentioned before, the accumulated fault detection time at any node is the maximum of fault detection times on all paths leading to it from the last checked task on the path. The fault detection times can be more accurately estimated during co-synthesis by considering actual start and finish times of associated tasks and communication edges. If the difference between the finish time of a check task and the start time of the last checked task in that path is more than $\tau^d$, extra check tasks would need to be added. On the other hand, this accurate estimate may also indicate that some check tasks are redundant. They can be deleted.

Application of the clustering method for CBFT to the task graph of FIG. 1(a) results in the five clusters shown in FIG. 1(e), assuming in this case that tasks t2, t3, and t4 are error-transparent and $\tau^d$ is sufficiently large (e.g., greater than the maximum deadline of 88).

2.2 Multidimensional Assertions

Each fault can affect the system in multiple ways and dimensions. A separate assertion check, whenever available, can be used to monitor each of these dimensions. For example, a single fault in the input interface of the OC-192 signal in a telecom system can be detected through checks based on a loss-of-clock, loss-of-frame, transmission bit error detection, loss-of-signal, loss-of-synchronization, excessive pointer adjustments, etc. The present algorithm allows the user to specify multiple types of assertions for each task and the algorithm uses the assertion or a combination of assertions that achieves the required fault coverage without incurring too much overhead.

2.3 Assertion Sharing

In embedded systems, there may be several tasks that require the same type of assertion check. Such an assertion task can be time-shared, if the associated checked tasks do not overlap in time, to further reduce the fault tolerance overhead. The pseudo-code of the assertion sharing procedure is given in FIG. 8. A similar technique can be used to time-share compare tasks as well.

Once the architecture is available, the actual start and finish times of each task and edge are stored after scheduling. For each PE, the algorithm first sorts the assertion tasks in the order of decreasing execution cost. For each unshared assertion from the sorted assertion list, an assertion sharing group is formed. The algorithm uses the EXPAND_ASSERTION_GROUP procedure to expand such an assertion sharing group based on architectural hints, if provided. If such hints are not provided (when system_assertion_sharing=FREE), a list of assertions of the same type is created. The algorithm picks an assertion from the list and creates an assertion sharing group which is expanded using the EXPAND_ASSERTION_GROUP procedure. Suppose two tasks $t_i$ and $t_j$, allocated to Ithe same PE, require the same type of assertion, say $t_c$. In order to evaluate the possibility of assertion sharing for these two tasks, the algorithm first checks whether there is any overlap of execution times of these assertion tasks during the hyperperiod. An overlap may be possible when these assertion tasks are mapped to a PE which allows concurrent execution, e.g., an ASIC. If there is no overlap, in order to reduce the resource requirement (total number of gates) or power dissipation or both, the algorithm modifies the execution time of task $t_c$ based on the assertion excess overhead vector. This modified execution time is used to schedule the shared assertion tasks. If deadlines are still met, the algorithm allows the assertion sharing and considers the next assertion from the list for possible assertion sharing with $t_c$.

Figure 9A:
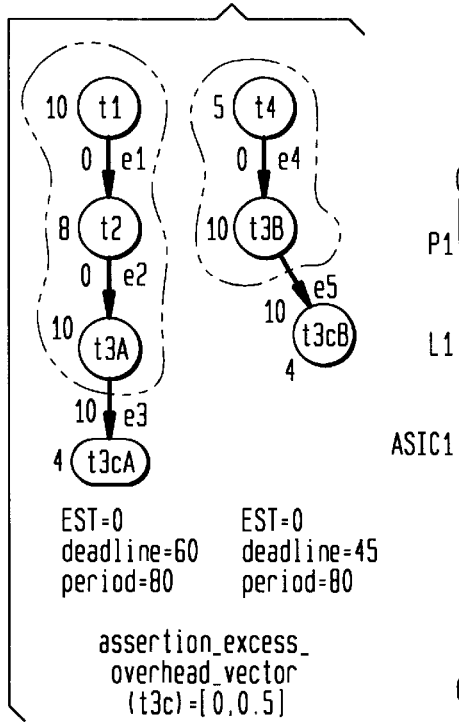
FIGS. 9(a)–(d) show exemplary task graphs and their attributes, a corresponding architecture, corresponding schedule without assertion sharing, and corresponding schedule with assertion sharing, respectively.
Figure 9B:
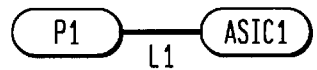
Figure 9C:
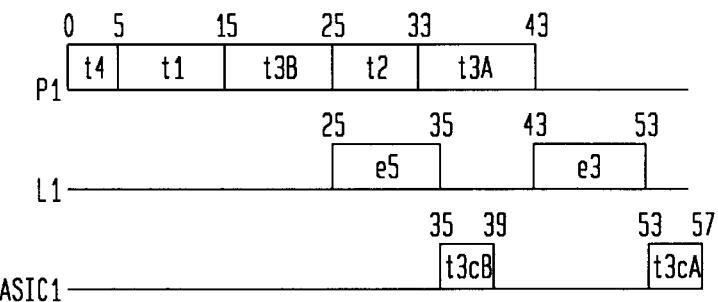
Figure 9D:
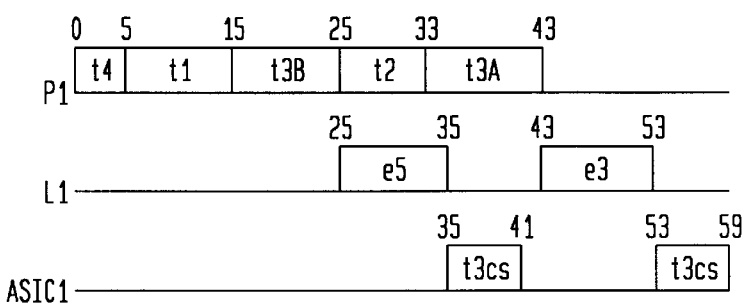

To illustrate the application of assertion sharing, consider the task graphs in FIG. 9(a). Assertion task t3c is used to check tasks t3A and t3B. The associated architecture is given in FIG. 9(b). The schedule without assertion sharing is given in FIG. 9(c). Since the execution times of tasks t3cA and t3cB do not overlap, assertion sharing is considered. The algorithm uses the assertion excess overhead vector of this assertion to compute the modified execution time for shared assertion task t3cs to be 4·(1+0.5)=6. This modified time is used to reschedule shared task t3cs. The resultant schedule is given in FIG. 9(d). Since all deadlines are still met, this assertion sharing is allowed. As shown in FIG. 9(d), though the length of the execution slot for t3cs is increased, the resource requirement in terms of the number of gates in ASIC1 is decreased due to the fact that the functional module for t3cs is now time-shared between two assertion tasks. This in turn supports the ultimate goal of reducing the embedded system cost while meeting real-time constraints. In certain examples, assertion sharing makes room for accommodating additional functions in a PE such that one or more PEs (ASIC, FPGA, etc.) can be eliminated.

2.4 Architecture Dependability

Critical applications of embedded systems demand highly dependable architectures. Architecture dependability largely relies on how efficiently a fault is detected and how fast the system recovers from a fault. Therefore, efficient fault diagnosis and error recovery procedures are important in achieving required dependability objectives of an embedded system. The following sections describe the procedure to impart fault diagnosis and error recovery and follow up with a method to evaluate embedded system architecture availability.

2.4.1 Fault Diagnosis and Error Recovery

Figure 10:
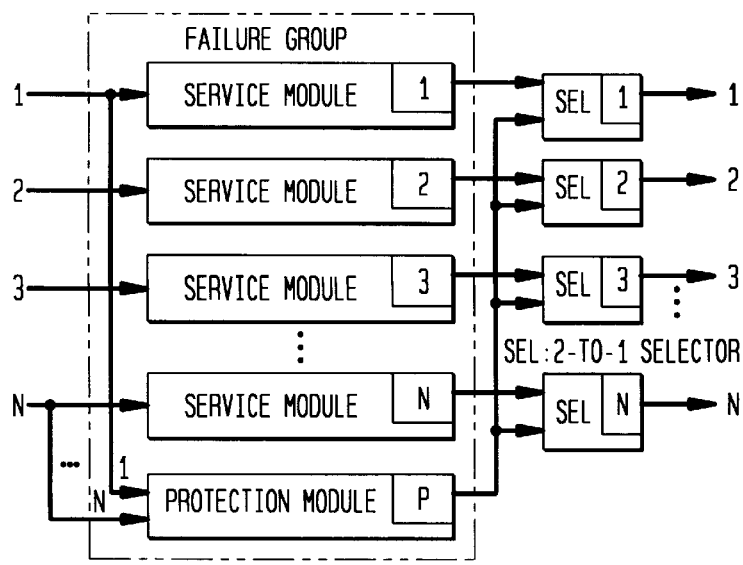
FIG. 10 shows 1-to-N protection philosophy.

A module may have more than one check task. Each check task indicates fault-free/faulty status which is stored. Once a fault is detected by a check task, a concept called hit timing is used to classify whether the detected fault is transient or permanent. To do this, the algorithm employs a counter to keep track of the number of times faults have been detected by the check task. This counter is cleared after a specific time interval. It has a programmable threshold. When the threshold is exceeded, an interrupt is generated for the diagnostic controller. The fault-isolation software running on the diagnostic controller monitors the interrupt status of various check tasks and declares that a permanent fault is located on the module. In case of systems requiring continuous operation, a switch to the protection or stand-by module needs to occur for permanent faults. The protection tasks are pre-assigned to the protection module to reduce the protection switch overhead. The present scheduler takes into account the overhead associated with the protection switch time so that deadlines are always met in the presence of a single fault. For efficient error recovery, an m-to-N topology is used where m protection modules are used for N service modules. FIG. 10 illustrates the 1-to-N protection philosophy for error recovery. The service and protection modules together form a failure group (FG).

In order to derive an efficient error recovery topology in the co-synthesis setting, the algorithm identifies the FGs and their interconnections such that the unavailability constraints (which are specified a priori as some fixed number of minutes per year for each task graph) of various task graphs are met. This problem is formulated as a restricted version of the graph isomorphism problem. See References (26)–(27). The algorithm starts with an architecture graph, where nodes represent PEs and edges represent links. The FG size is defined based on architectural hints for the task graph, if specified, and the task graph unavailability constraint. If more than one task graph are executed on a given FG, its unavailability constraint is set to the minimum of the unavailability constraints of all associated task graphs. The error recovery topology definition procedure is given in FIG. 11. The algorithm uses the architecture, architectural hints for FGs, and task graphs to derive the error recovery topology. Architectural hints can indicate the PEs and links required to implement specific task graphs, which can form part of an FG. For example, a set of PEs and links that execute a set of task graphs for the control function can form part of an FG. Existence of such hints is not necessary. However, if hints are available, the FGs are formed based on them. All PEs and links, to which a group of task graphs (for which a hint is provided) is allocated, form the pilot group (PG) for such an FG. There can be more than one task graph being executed on a PG. Recall that FG is a group of service and standby modules, and therefore PG is a subset of FG. PG is a group of service PEs and links that are switched out together to a set of protection PEs and links in the event of failure in any one of the associated service PEs and links. Next, the PG is duplicated to provide 1-to-1 protection.

The EXPAND_FAILURE_GROUP procedure is used to expand the FG in two dimensions: horizontal and vertical. In the horizontal dimension, the PG is expanded, while, in the vertical dimension, the FG is expanded to increase the number of service modules (which have an architecture graph isomorphic to that of PG) to reduce the fault tolerance overhead. Expansion of the PG is limited by the PG limit (PG_limit). If the pilot group is too large and executes a large number of task graphs, then the FIT rate of the pilot group will be high. Also, in the event of PG failure, a large number of task graphs will be affected, which may not be acceptable from the quality of service standpoint, even though the system unavailability criteria may be met. In order to address this aspect, FG's horizontal expansion threshold, known as PG_limit, is specified a priori in terms of the number of concurrent task graphs executed in the PG. During expansion of the FG in both horizontal and vertical dimensions, the algorithm makes sure that the unavailability constraints are met using Markov models of the FGs derived for each task graph. In alternative embodiments, Petri nets and/or reliability block diagrams could be used instead of Markov models to determine unavailability of each allocation. The CREATE_FAILURE_GROUP procedure given in FIG. 12 is used to create FGs for those PEs which are not covered by architectural hints, followed up with the EXPAND_FAILURE_GROUP procedure to expand such FGs, as explained above.

To illustrate the application of the error recovery topology definition procedure, consider the architecture graph shown in FIG. 13(a). It has four PEs of the same type, P1 (P1a is an instance of P1, and so on), executing the same type of task graphs concurrently. The pilot group containing P1a is formed, as shown in FIG. 13(b). Then the pilot group is duplicated by adding a protection PE of the same type, P1Pa. Next, expansion of this pilot group is considered if the unavailability criteria are met. The algorithm creates a list of PEs of the same type, which has connections isomorphic to the pilot group, in order to expand the pilot group in the horizontal dimension. First, PG_limit is determined to be the number of concurrent task graphs executed in the pilot group. For example, suppose that a PG is executing a task graph for the DS-3 signal (a 44.736 Mb/s transmission signal comprising of 672 telephone channels in a telecom system). In the event of failure, a protection switch occurs and the service related to one DS-3 signal is affected. If the PG_limit is set to two, then the PG is expanded to include PEs and links that perform functions for two DS-3 signals. Now, even if failure occurs in a PE/link that supports one DS-3 signal, the entire PG is switched to a stand-by module. In this scenario, the second DS-3 signal is interrupted even if the failure is not associated with any PE/link servicing the second signal. Therefore, on the one hand, it is desirable to decrease the PG_limit to minimize the adverse impact on the system during protection switch. On the other hand, however, it is desirable to increase the PG_limit such that the protection switch overhead is minimized. In FIG. 13, the PG_limit is assumed to be two. Therefore, P1b is added to the pilot group, followed up by expanding the protection group, as shown in FIG. 13(c). Recall that the pilot group and protection group together form the FG. Next, expansion of the FG in the vertical dimension is considered by identifying a set of PEs for which the architecture graph is isomorphic to that of the pilot group. In this case, the set consisting of P1c and P1d is identified. P1c and P1d are added to the FG, as shown in FIG. 13(d). The resulting FG interconnection graph is shown in FIG. 13(e), which is used to estimate the unavailability of this FG. The above process is repeated for the remaining PEs: P2 and P3.

In order to increase the availability of the protection modules, a set of background diagnostic tasks is scheduled on them. The frequency $f$ of the execution of the background diagnostics is determined a priori. However, it may be increased if deemed necessary to meet the unavailability requirements during FG unavailability analysis.

2.4.2 Architecture Dependability Analysis

The system is characterized as being an interconnection of several FGs, where each FG can have either 1-to-1, 1-to-N or m-to-N protection or no spare modules. Even though a single PE fault model is assumed, m-to-N protection may still be needed to protect against subsequent faults that occur before the first one is repaired (in other words, to decrease the unavailability). More faults in an FG than it can handle leads to system failure. In order to determine the architecture availability, Markov models are used (see References (28)–(30)) to determine the unavailability of each FG. There are two major contributors to system unavailability or downtime: hardware faults and software faults. In order to characterize hardware faults, the algorithm uses the FIT rate of each hardware component which is specified a priori. For all software tasks allocated to the hardware component, the composite FIT rate is estimated using the execution-time model. See Reference (30). To facilitate unavailability analysis, in addition to the FIT rate of each component, it is also assumed that the MTTR is specified a priori. To estimate the FIT rate for a general-purpose processor (software), the algorithm sums up the associated hardware FIT rate and the composite FIT rate of the allocated software tasks.

Once the FGs are formed, the procedure given in FIG. 14 is used to perform the dependability analysis. If the calculated unavailability fails to meet the system unavailability constraints, the algorithm rejects the architecture and continues with the next possible allocation.

3 The COFTA Algorithm

In this section, an overview of the present co-synthesis algorithm, COFTA, is provided. FIG. 15 presents the present co-synthesis process flow. The task graphs, system/task constraints, and resource library are parsed and appropriate data structures are created during the parsing step. The task clustering technique for CBFT is used to form clusters. During cluster formation, the algorithm uses the concept of error transparency and fault detection latency for the placement of assertion and duplicate-and-compare tasks. The hyperperiod of the system is computed and the association array is formed that stores the various attributes of each copy of a task graph in the hyperperiod. In traditional real-time computing theory, if $period_i$ is the period of task graph i, then {hyperperiod÷$period_i$} copies are obtained for it. See Reference (25). However, this is impractical from both co-synthesis CPU time and memory requirements point of view, especially for multi-rate task graphs for which this ratio may be very large. The concept of an association array (see Reference (16)) is used to tackle this problem.

Clusters are ordered based on their priority (a formal definition of the priority level of a cluster is provided in Section 3.3). The mapping of tasks (edges) to PEs (communication links) is determined during the allocation step. COFTA has two loops in the co-synthesis process flow: 1) an outer loop for selecting clusters, and 2) an inner loop for evaluating various allocations for each cluster. For each cluster, an allocation array consisting of the possible allocations is created. The size of this array is kept at manageable levels by limiting the number of extra PEs and links added at each step. While allocating a cluster to an ASIC or FPGA, it is made sure that the PE's capacity related to pinout, gate count, and power dissipation is not exceeded. The algorithm uses the power dissipation estimation procedure from Reference (16) to estimate the power dissipation of each PE and link, and checks whether the constraints are exceeded. Also, while allocating a cluster to a general-purpose processor, it is made sure that the memory capacity of the PE is not exceeded. Inter-cluster edges are allocated to resources from the link library.

In the scheduling step, the relative ordering of task/communication execution and the start and finish times for each task and edge are determined. The algorithm employs a combination of preemptive and non-preemptive static scheduling. The algorithm also takes into consideration the operating system overheads such as interrupt overhead, context-switch, remote procedure call, etc., through a parameter called preemption overhead. The preemption overhead is determined experimentally and given to the co-synthesis algorithm beforehand. Incorporating scheduling into the inner loop facilitates accurate performance evaluation. Performance evaluation of an allocation is extremely important in picking the best allocation. An important part of performance evaluation is finish-time estimation. This estimation process determines the start and finish times of each task employing the longest path algorithm (see Reference (16)) to check whether a task with a specified deadline meets it. In addition to the finish-time estimation, the algorithm also calculates the overall FIT rate of the architecture and ascertains whether it meets the system unavailability constraints. The allocation evaluation step compares the current allocation against previous ones based on total dollar cost. If there are more than one allocation with equal dollar cost, then the algorithm picks the allocation for which the summation of the unavailability of all FGs is minimum. FIG. 16 gives the pseudo-code for the COFTA procedure. In the following sections, each step of COFTA is described in detail.

3.1 Task Clustering for Fault Tolerance

The present task clustering technique was presented earlier in Section 2.1.2. Fault tolerance is imparted by adding assertion tasks, when available, else duplicate-and-compare tasks to some tasks. The duplicate-and-compare tasks inherit the preference and exclusion vectors of the original task. In addition, the exclusion vector of the duplicate/compare or assertion task is formed such that they are prevented from being allocated to the same PE as the checked task. This is done to prevent a fault from affecting both the checked and added task(s). However, duplicate and compare tasks can both be mapped to the same PE, since a fault in that PE will not affect the validity of the checked task's output. This technique exploits the fact that certain tasks may be error-transparent, and duplicate-and-compare and assertion tasks can be eliminated if the fault detection latency requirements are met.

3.2 The Association Array

It was shown in Reference (25) that there exists a feasible schedule for a job if and only if there exists a feasible schedule for the hyperperiod. Therefore, traditionally, as mentioned before, each task graph is replicated the requisite number of times in the hyperperiod. This is the approach used in Reference (15). The advantage of this approach is that it allows different instances of a task to be allocated to different PEs. However, this flexibility comes at a severe price in terms of co-synthesis CPU time and memory requirement when the hyperperiod is large compared to the periods. In order to address this concern, the concept of association array was proposed in Reference (16). This concept is used to eliminate the need for replication of task graphs. Experience from COSYN (see Reference (16)) shows that up to 13-fold reduction in co-synthesis CPU time is possible using this concept for medium-sized task graphs with less than 1% increase in embedded system cost.

An association array has an entry for each copy of each task and contains information such as: 1) the PE to which it is allocated, 2) its priority level, 3) its deadline, 4) its best-case finish time, and 5) its worst-case finish time. The deadline of the nth instance of a task is offset by (n−1) multiplied by its period from the deadline in the original task. The association array not only eliminates the need to replicate the task graphs, but it also allows allocation of different task graph instances to different PEs, if desirable, to derive an efficient architecture. This array is created after cluster formation and is updated after scheduling. It also supports pipelining of task graphs, when necessary, to derive an efficient architecture. See Reference (16).

There are two types of periodic task graphs: 1) those with a deadline less than or equal to the period, and 2) those with a deadline greater than the period. In order to address this fact, an association array can have two dimensions, as explained next. If a task graph has a deadline less than or equal to its period, it implies that there will be only one instance of the task graph in execution at any instant. Such a task graph needs only one dimension in the association array, called the horizontal dimension. If a task graph has a deadline greater than its period, it implies that there can be more than one instance of this task graph in execution at some instant. For such tasks, a two-dimensional association array is created, where the vertical dimension corresponds to concurrent execution of different instances of the task graph.

3.3 Cluster Allocation

Once the clusters are formed, they need to be allocated. The priority level of a cluster is defined as the maximum of the priority levels of the constituent tasks and incoming edges. Clusters are ordered based on decreasing priority levels. After the allocation of each cluster, the algorithm recalculates the priority level of each task and cluster. The algorithm picks the cluster with the highest priority level and creates an allocation array of the possible allocations for the given cluster at that point n co-synthesis. Once the allocation array is formed, the inner loop of co-synthesis is used to evaluate the allocations from this array.

3.3.1 The Outer Loop of Co-Synthesis

The allocation array considers the following: 1) architectural hints, 2) preference vector, 3) allocation of the cluster to existing resources in the partial architecture, 4) upgrade of link, 5) upgrade of PEs, 6) addition of PEs, and 7) addition of links. Architectural hints are used to pre-store allocation templates (these templates correspond to the mapping of sub-task-graphs to part of the architecture being built). Excluded are those allocations for which the pin count, gate count, memory limits, and power constraints are exceeded. During allocation array formation, addition of up to two new PEs and links of the same type is allowed to keep the size of the allocation array at manageable levels. However, the algorithm does allow the user to specify the limit on the number of new PEs and links of the same type that can be used at any step for allocation purposes.

3.3.2 The Inner Loop of Co-Synthesis

Once the allocation array is formed, all allocations are marked as unvisited. The allocations in the allocation array are ordered in the order of increasing dollar cost. The algorithm picks the unvisited allocation with the lowest dollar cost, marks it visited, and goes through the scheduling and performance estimation steps described next.

3.4 Scheduling

The algorithm employs a combination of preemptive and non-preemptive priority-level based static scheduler for scheduling tasks and edges on all PEs and links in the allocation. The algorithm usually needs to schedule the first copy of the task only. The start and finish times of the remaining copies are updated in the association array. However, the algorithm does sometimes need to schedule the remaining copies. To determine the order of scheduling, tasks and edges are ordered based on the decreasing order of their priority levels. If two tasks (edges) have equal priority levels then the algorithm schedules the task (edge) with the shorter execution (communication) time first. While scheduling communication edges, the scheduler considers the mode of communication (sequential or concurrent) supported by the link and the processor. Though preemptive scheduling is sometimes not desirable due to the overhead associated with it, it may be necessary to obtain an efficient architecture. The algorithm takes preemption overhead into consideration during scheduling. The preemption overhead, $\xi$, is determined experimentally considering the operating system overhead. It includes context switching and any other processor-specific overheads. Preemption of a higher priority task by a lower priority task is allowed only in the case when the higher priority task is a sink task that will not miss its deadline, in order to minimize the scheduling complexity.

3.4.1 Performance Estimation

The algorithm estimates the finish times of all tasks with specified deadlines and check whether their deadlines are met. For fault tolerance overhead optimization, in addition to the finish time, the algorithm identifies the FGs for efficient error recovery and evaluates the unavailability of various FGs as well as the architecture using Markov models.

The algorithm stores the best- and worst-case start as well as finish times of each task and edge. When a task (edge) gets allocated, its minimum and maximum execution (communication) times become equal and correspond to the execution (communication) time on the PE (link) to which it is allocated, as shown in the finish time estimation graph in FIG. 1(f) (cluster C1 is mapped to P1 and no other mapping is assumed to be performed yet). The numbers in the braces, e.g., {104, 96} adjacent to t4c, indicate maximum and minimum finish times, and the numbers in the parentheses, e.g., (21,11) adjacent to t3, represent its maximum and minimum execution times, respectively.

Following finish-time estimation, actual start and stop times of the task and communication edges are also used to calculate the fault detection latencies of each check (assertion or compare) task. If necessary, additional assertion and/or duplicate-and-compare tasks are added to meet system fault detection latency requirements. In addition, the unavailability of each FG is estimated to assess the overall unavailability of various system functions, as shown in FIG. 14.

3.4.2 Allocation Evaluation

Each allocation is evaluated based on the total dollar cost. The algorithm picks the allocation that at least meets the deadlines in the best case. If no such allocation exists, the algorithm picks an allocation for which the summation of the best-case finish times of all task graphs is maximum. The best-case finish time of a task graph is the maximum of the best-case finish times of the constituent tasks with specified deadlines. This generally leads to a less expensive architecture. Note that "maximum" is used instead of "minimum" to be frugal with respect to the embedded system architecture cost at the intermediate steps. If deadlines are not met, then the algorithm has the option of upgrading the architecture at a later step anyway.

3.5 Application of the Co-Synthesis Algorithm

Figure 17A:
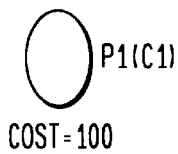
FIGS. 17(a)–(i) demonstrates the application of the COFTA procedure.
Figure 17B:
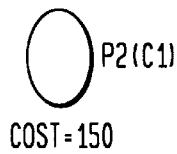
Figure 17C:
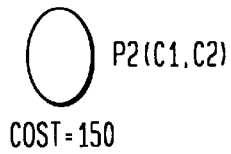
Figure 17D:
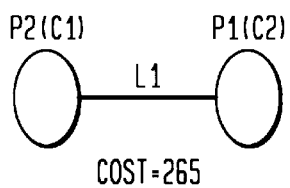
Figure 17E:
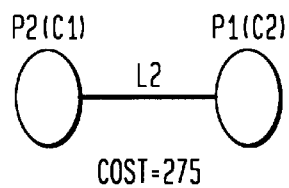
Figure 17F:
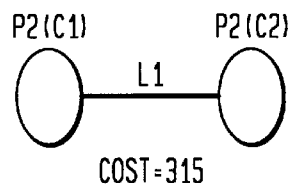
Figure 17G:
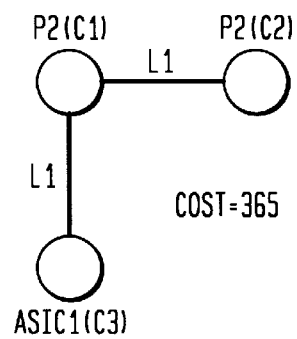
Figure 17H:
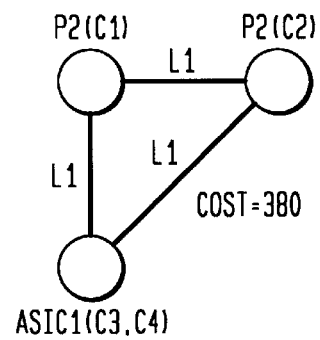
Figure 17I:
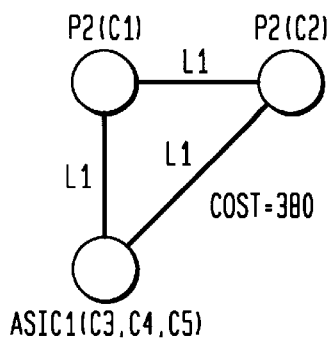

The algorithm next applies COFTA to the augmented task graph of FIG. 1(e). The five clusters are ordered based on the decreasing value of their priority levels. FIG. 17 illustrates the allocation of various clusters during the outer and inner loops of co-synthesis. Since cluster C1 has the highest priority level, it is allocated first to the cheaper processor P1, as shown in FIG. 17(a). The scheduler is run and the finish time is estimated, as shown in FIG. 1(f). Since t4's deadline is not met in the best case, the allocation is upgraded, as shown in FIG. 17(b). Now since deadlines are met, cluster C2 is considered for allocation. First, an attempt is made to allocate cluster C2 to the current PE, as shown in FIG. 17(c). After scheduling, since finish-time estimation indicates that deadlines cannot be met in the best case, the allocation needs to be upgraded, as shown in FIG. 17(d). Similarly, the allocation is continuously upgraded until the allocation configuration shown in FIG. 17(f) is reached, where deadlines are met in the best case. During allocation evaluation, the algorithm does not change the allocation of previously allocated clusters. For example, while evaluating various allocations for cluster C2, the algorithm does not change the allocation for cluster C1. However, the algorithm may downgrade one or more components of the allocation, as done between the allocations shown in FIGS. 17(e) and 17(f). In this case, though the link is downgraded from L2 to L1 the overall cost of the allocation is increased by adding a more powerful processor P2. Next, cluster C3 is considered for allocation. Since C3 is excluded from being allocated to P1 or P2 (see FIG. 1(c)), it is allocated to ASIC1, as shown in FIG. 17(g). Now since deadlines are met, cluster C4 is considered for allocation, as shown in FIG. 17(h). Since deadlines are again met, cluster C5 is considered for allocation. An attempt is made to allocate cluster C5 to the existing PE, ASIC1 as shown in FIG. 17(i). Since the deadlines are met and all clusters are allocated, the distributed heterogeneous architecture given in FIG. 17(i) is the final solution.

4 Experimental Results

COFTA is implemented in C++. It was run on various Bell Laboratories telecom transport system task graphs. These are large task graphs representing real-life field applications. The execution times for the tasks in these task graphs were either experimentally measured or estimated based on existing designs. The general-purpose processors in the resource library had the real-time operating system, pSOS+, running on them. The execution times included the operating system overhead. For results on these graphs, the PE library was assumed to contain Motorola microprocessors 68360, 68040, 68060 (each processor with and without a second-level cache), nine ASICs, one XILINX 3195A FPGA, one ORCA 2T15 FPGA, and two optical transmitter and receiver modules. The link library was assumed to contain a 680X0 bus, a 1 Mb/s LAN, a 10 Mb/s LAN, a 6.176 Mb/s serial link supporting broadcast mode, and a 31 Mb/s serial link. The FIT rates for various modules are shown in Table 1 and they were either based on the existing designs or estimated using Bellcore guidelines. See Reference (31). MTTR was assumed to be two hours, since transport systems are part of the central office and are considered as attended equipment. The unavailability constraints for task graphs providing provisioning and transmission functions were assumed to be 12 minutes/year and 4 minutes/year, respectively.

Tables 2 and 3 show that COFTA was able to handle these task graphs efficiently. Cost of the architecture is the summation of the cost of PEs and links in it. When two architectures derived by two different algorithms have an equal number of PEs and links, but different dollar costs, it implies that they employ PEs/links of different types. CPU times for co-synthesis were measured on a Sparcstation 20 with 256 MB RAM. Table 2 shows the efficacy of COFTA in deriving fault-secure architectures. There are five major columns in Table 2. The first column shows the name of the example and the number of tasks in it. The second column represents co-synthesis of architectures without any fault security. In the third column, fault security was imparted using TBFT. The fourth column indicates the cost of the double-modular redundant (DMR) architecture where outputs of two simplex architectures are compared. In this case, the cost of the simplex architecture (second column) was simply doubled, ignoring the cost of the comparison elements. In the fifth column, fault security was imparted using CBFT. For fault-secure architectures, COFTA (fifth column) resulted in an average (average of individual cost reductions; averages are derived similarly for other columns) architecture cost reduction of 46.3% over DMR and 13.7% over TBFT (third column). Another important observation is that the average cost overhead of COFTA fault-secure architectures over simplex architectures is only 7.3%. Note that the cost overhead of a DMR architecture over a simplex architecture is at least 100%.

Table 3 shows the efficacy of COFTA in deriving fault-tolerant architectures. There are five major columns in Table 3. The second column represents simplex architectures without fault-security or fault tolerance. In the third column, TBFT was used to impart fault detection, followed by error recovery. The fourth column indicates the cost of the triple-modular redundant (TMR) architectures. In this case, the cost of the simplex architecture (second column) was simply tripled, ignoring the cost of the voting elements. In the fifth column, COFTA was used with CBFT, assertion sharing, and error recovery to impart fault tolerance. For fault-tolerant architectures, COFTA is able to achieve an average architecture cost reduction of 48.2% over TMR and 14.7% over TBFT. Also, the average cost overhead of the COFTA fault-tolerant architectures over simplex architectures is only 55.4%. Note that TMR architectures have a cost overhead of at least 200% over simplex architectures. COFTA did not result in large cost savings for OAS1/2/3/4 examples over TBFT, because the optical receiver/transmitter modules dominated the cost. If these modules were excluded from consideration, the overall cost reduction for these four examples was 16.2% for fault security and 21.7% for fault tolerance, compared to TBFT.

The COFTA systems that achieved the experimental results described above was based on an experimental software version having many debug statements. As such, even further improvements in CPU time could be achieved by optimizing the code for performance.

5 Conclusions

The present invention is directed to an efficient co-synthesis algorithm for fault-tolerant heterogeneous distributed embedded system architectures. Experimental results on various large real-life telecom transport system examples are very encouraging. This is the first hardware-software co-synthesis algorithm to optimize dependability. The CBFT technique is proposed to take advantage of task error transparency to reduce the fault tolerance overhead. The error transparency property is common in telecom system task graphs. A new technique is proposed to identify the failure groups for efficient error recovery. Also provided are methods to exploit multi-dimensional assertions as well as assertion sharing to further reduce the overhead.

References

The following references are incorporated herein by reference:

(1) M. R. Garey and D. S. Johnson, Computers and Intractability: A Guide to the Theory of NP-Completeness, W.H. Freeman and Co., 1979.
(2) Y.-K. Kwok and I. Ahmad, "Dynamic critical-path scheduling: An effective technique for allocating task graphs to multiprocessors," IEEE Trans. Parallel & Distributed Systems, vol. 7, pp. 506–521, May 1996.
(3) A. Kalavade and E. A. Lee, "A hardware-software codesign methodology for DSP applications," IEEE Design & Test of Computers, vol. 10, no. 3, pp. 16–28, September 1993.
(4) R. Ernst, J. Henkel and T. Benner, "Hardware-software co-synthesis for microcontrollers," IEEE Design & Test of Computers, vol. 10, no. 4, pp. 64–75, December 1993.
(5) F. Vahid, J. Cheng, and D. D. Gajski, "A binary-constraint search algorithm for minimizing hardware during hardware/software partitioning," in Proc. European Design Automation Conf., pp. 214–219, September 1994.
(6) E. Barros, W. Rosenstiel and X. Xiong, "A method for partitioning UNITY language to hardware and software," in Proc. European Design Automation Conf., pp. 220–225, September 1994.
(7) A. Jantsch, et al., "Hardware/software partitioning and minimizing memory interface traffic," in Proc. European Design Automation Conf., pp. 226–231, September 1994.
(8) R. K. Gupta, Hardware-Software Cosynthesis of Digital Systems, Ph.D. thesis, Stanford University, 1994.
(9) W. Wolf, "Hardware-software co-design of embedded systems," Proc. IEEE, pp. 967–989, July 1994.
(10) S. Prakash and A. Parker, "SOS: Synthesis of application-specific heterogeneous multiprocessor systems," J. Parallel & Distributed Comput., vol. 16, pp. 338–351, December 1992.
(11) J. G. D'Ambrosio and X. Hu, "Configuration-level hardware/software partitioning for real-time systems," in Proc. Int. Wkshp. Hardware-Software Co-Design, pp. 34–41, September 1994.
(12) T.-Y. Yen and W. Wolf, "Communication synthesis for distributed embedded systems," in Proc. Int. Conf. Computer-Aided Design, pp. 288–294, November 1995.
(13) J. Hou and W. Wolf, "Process partitioning for distributed embedded systems," in Proc. Int. Wkshp. Hardware/Software Codesign, pp. 70–76, September 1996.
(14) D. Kirovski and M. Potkonjak, "System-level synthesis of low-power real-time systems," in Proc. Design Automation Conf., pp. 697–702, June 1997.
(15) S. Srinivasan and N. K. Jha, "Hardware-software co-synthesis of fault-tolerant real-time distributed embedded systems," in Proc. European Design Automation Conf., pp. 334–339, September 1995.
(16) B. P. Dave, G. Lakshminarayana, and N. K. Jha, "COSYN: Hardware-software co-synthesis of embedded systems," in Proc. Design Automation Conference, pp. 703–708, June 1997.
(17) S. Yajnik, S. Srinivasan and N. K. Jha, "TBFT: A task based fault tolerance scheme for distributed systems," in Proc. ISCA Int. Conf. Parallel & Distributed Computing Systems, pp. 483–489, October 1994.
(18) S. M. Shatz, J.-P. Wang, and M. Goto, "Task allocation for maximizing reliability of distributed computer systems," IEEE Trans. Comput., vol. 41, pp. 1156–1168, September 1992.
(19) S. Kartik and C. S. R. Murthy, "Improved task-allocation algorithms to maximize reliability of redundant distributed computing systems," IEEE Trans. Reliability, vol. 44, no. 4, pp. 575–586, December 1995.
(20) A. Dasgupta and R. Karri, "Optimal algorithms of reliable application-specific heterogeneous multiprocessors," IEEE Trans. Reliability, vol. 44, no. 4, pp. 603–613, December 1995.
(21) F. Distante and V. Piuri, "Hill-climbing heuristics for optimal hardware dimensioning and software allocation in fault-tolerant distributed systems," IEEE Trans. Reliability, vol. 38, no. 1, pp. 28–39, April 1989.
(22) S. Srinivasan and N. K. Jha, "CRAFT: Criticality based fault tolerance for real-time distributed systems with resource constraints," in Proc. ISCA Int. Conf. Parallel & Distributed Computing Systems, pp. 513–520, September 1995.
(23) N. K. Jha and S. Kundu, Testing and Reliable Design of CMOS Circuits, Kluwer Academic Publishers, Norwell, Mass., 1990.
(24) F. Wang, K. Ramamritham, and J. A. Stankovic, "Determining redundancy levels for fault tolerant real-time systems," IEEE Trans. Comput., vol. 44, pp. 292–301, February 1995.
(25) E. Lawler and C. Martel, "Scheduling periodically occurring tasks on multiple processors," Information Processing Letters, vol. 12, pp. 9–12, February 1981.
(26) D. G. Corneil, and C. C. Gotlieb, "An efficient algorithm for graph isomorphism," J. ACM, vol. 17, no. 1, pp. 51–64, January 1970.
(27) C. M. Hoffman, Group-Theoretic Algorithms and Graph Isomorphism, Springer-Verlag, Berlin, 1982.
(28) N. Ravinchandran, Stochastic Methods in Reliability, John Wiley & Sons, New York, 1990.
(29) K. K. Aggarwal, Reliability Engineering, Kluwer Academic Publishers, Dodrecht, The Netherlands, 1993.
(30) J. D. Musa, A. Iannino, K. Okumoto, Software Reliability: Measurement, Prediction, Application, McGraw-Hill, New York, 1990.
(31) Bellcore, "Generic reliability assurance requirements for fiber optic transport systems," Technical Reference, TR-NTW-00418, December 1992.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. A computer-implemented method for designing the architecture of an embedded system, comprising:
   (a) a pre-processing phase comprising the steps of:
      (1) parsing one or more task graphs, one or more system/task constraints, and a resource library for the embedded system; and
      (2) assigning one or more fault detection tasks to one or more original tasks in the task graphs to enable the embedded system to perform fault detection for the one or more original tasks; and
   (b) a synthesis phase, following the pre-processing phase, comprising the steps of allocating the fault detection tasks and one or more groups of one or more original tasks to one or more processing elements (PEs) in the resource library and allocating one or more edges in the task graphs to one or more communication links in the resource library, based on performance evaluation of one or more possible allocations for each of the groups, edges, and fault detection tasks in light of the system/task constraints, wherein the pre-processing phase comprises the step of performing task clustering on the one or more task graphs to form one or more clusters for the embedded system, wherein task clustering comprises the steps of:
      (i) assigning a fault tolerance (FT) level to each original task based on execution time, communication time, and any associated fault detection tasks; and
      (ii) determining an appropriate cluster for each original task based on the FT level in order to reduce FT overhead.

2. The method of claim 1, wherein each fault detection task is either an assertion task or a duplicate-and-compare task pair comprising a duplicate task and a compare task.

3. The method of claim 2, wherein an original task and any associated assertion task are implemented on different PEs.

4. The method of claim 2, wherein an original task and any associated duplicate task are implemented on different PEs.

5. The method of claim 4, wherein both the duplicate task and the compare task of a duplicate-and-compare task pair are allocated on PEs different from the PE for the associated original task.

6. The method of claim 1, wherein a combination of two or more fault detection tasks are used for fault detection for at least one original task.

7. The method of claim 1, wherein the FT level is recalculated after each original task is grouped into a cluster.

8. The method of claim 1, wherein the FT level for an original task is based on the longest path from the original task to a sink task considering an assertion overhead assigned to the original task and communication.

9. The method of claim 1, wherein, during task clustering, the original tasks are sequentially selected based on priority levels of the tasks.

10. The method of claim 9, wherein the priority levels are recalculated after each original task is grouped into a cluster.

11. The method of claim 9, wherein the priority levels are deadline-based priority levels.

12. The method of claim 1, wherein error transparency and allowable system fault tolerance detection latency are used to define placements for the fault detection tasks.

13. The method of claim 1, wherein two or more original tasks are allocated to the same PE and one or more of the associated fault detection tasks are removed to reduce fault tolerance overhead.

14. The method of claim 1, wherein two or more original tasks share a single fault detection task.

15. The method of claim 14, wherein the single fault detection task is an assertion task.

16. The method of claim 15, wherein the assertion task is time-shared to limit fault tolerance overhead, if the two or more checked tasks do not overlap in time.

17. An embedded system having an architecture generated using the method of claim 1.

18. A computer-implemented method for designing the architecture of an embedded system, comprising:
   (a) a pre-processing phase comprising the step of parsing one or more task graphs, one or more system/task constraints, and a resource library for the embedded system;
   (b) a synthesis phase, following the pre-processing phase, comprising the steps of allocating one or more groups of one or more tasks in the task graphs to one or more processing elements (PEs) in the resource library and allocating one or more edges in the task graphs to one or more communication links in the resource library, based on performance evaluation of one or more possible allocations for each of the groups and edges in light of the system/task constraints; and
   (c) an error recovery topology derivation phase comprising the step of deriving an error recovery topology for the embedded system by defining one or more failure groups, wherein each failure group comprises one or more service modules, one or more protection modules, and one or more switches for substituting a protection module for a service module, if a permanent error is detected in the service module.

19. The method of claim 18, wherein each PE in a protection module is implemented on a different board from every PE in a corresponding service module.

20. The method of claim 18, wherein at least one failure group is based on one or more architectural hints.

21. The method of claim 20, wherein the at least one failure group is initially defined as a pilot group and the at least one failure group is then grown horizontally by expanding the pilot group and/or vertically by adding service modules to the at least one failure group.

22. The method of claim 18, wherein a permanent error in a service module is detected when a specified number of errors occur in the service module within a specified duration.

23. An embedded system having an architecture generated using the method of claim 18.

24. A computer-implemented method for designing the architecture of an embedded system, comprising:
   (a) a pre-processing phase comprising the step of parsing one or more task graphs, one or more system/task constraints including one or more system/task unavailability constraints, and a resource library for the embedded system, where a system/task unavailability constraint imposes a limit on an amount of time that a corresponding system or task is not operational; and
   (b) a synthesis phase, following the pre-processing phase, comprising the steps of allocating one or more groups of one or more tasks in the task graphs to one or more processing elements (PEs) in the resource library and allocating one or more edges in the task graphs to one or more communication links in the resource library, based on performance evaluation of one or more possible allocations for each of the groups and edges in light of the system/task constraints, wherein the performance evaluation includes determining whether one or more system/task unavailability constraints are met.

25. The method of claim 24, wherein unavailability of each failure group in the embedded system is determined using Markov models.

26. The method of claim 24, wherein system unavailability is a function of hardware faults and software faults.

27. The method of claim 26, wherein the hardware and software faults are characterized based on a failure-in-time rate for each module, and the software faults are further characterized based on an execution-time model.

28. An embedded system having an architecture generated using the method of claim 24.

29. A method for designing the architecture of an embedded system, comprising:
  (a) a pre-processing phase comprising the steps of:
    (1) parsing one or more task graphs, one or more system/task constraints, and a resource library for the embedded system; and
    (2) assigning one or more permanent fault detection tasks and zero, one, or more transient fault detection tasks to one or more original tasks in the tasks graphs to enable the embedded system to perform fault detection for the one or more original tasks; and
  (b) a synthesis phase, following the pre-processing phase, comprising the step of allocating the one or more permanent fault detection tasks and zero, one, or more transient fault detection tasks and one or more groups of one or more original tasks to one or more processing elements (PEs) in the resource library and allocating one or more edges in the tasks graphs to one or more communication links in the resource library, based on performance evaluation of one or more possible allocations for each of the groups, edges, and fault detection tasks in light of the system/task constraints.

30. A method for designing the architecture of an embedded system, comprising:
  (a) a pre-processing phase comprising the steps of:
    (1) parsing one or more task graphs, one or more system/task constraints, and a resource library for the embedded system; and
    (2) assigning one or more fault detection tasks to one or more original tasks in the tasks graphs to enable the embedded system to perform fault detection for the one or more original tasks; and
  (b) a synthesis phase, following the pre-processing phase, comprising the step of allocating the fault detection tasks and one or more groups of one or more original tasks to one or more processing elements (PEs) in the resource library and allocating one or more edges in the tasks graphs to one or more communication links in the resource library, based on performance evaluation of one or more possible allocations for each of the groups, edges, and fault detection tasks in light of the system/task constraints, wherein error transparency and allowable system fault tolerance detection latency are used to define placements for the fault detection tasks.

31. A method for designing the architecture of an embedded system, comprising:
  (a) a pre-processing phase comprising the steps of:
    (1) parsing one or more task graphs, one or more system/task constraints, and a resource library for the embedded system; and
    (2) assigning one or more fault detection tasks to one or more original tasks in the tasks graphs to enable the embedded system to perform fault detection for the one or more original tasks; and
  (b) a synthesis phase, following the pre-processing phase, comprising the step of allocating the fault detection tasks and one or more groups of one or more original tasks to one or more processing elements (PEs) in the resource library and allocating one or more edges in the tasks graphs to one or more communication links in the resource library, based on performance evaluation of one or more possible allocations for each of the groups, edges, and fault detection tasks in light of the system/task constraints, wherein two or more original tasks share a single fault detection task.

32. The method of claim 31, wherein the single fault detection task is an assertion task.

33. The method of claim 32, wherein the assertion task is time-shared to limit fault tolerance overhead, if the two or more checked tasks do not overlap in time.

* * * * *